(12) United States Patent
You

(10) Patent No.: US 7,274,420 B2
(45) Date of Patent: Sep. 25, 2007

(54) METHOD FOR MANUFACTURING REFLECTION-TRANSMISSION TYPE LIQUID CRYSTAL DISPLAY DEVICE

(75) Inventor: Chun-Gi You, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/354,789

(22) Filed: Feb. 15, 2006

(65) Prior Publication Data

US 2006/0132685 A1    Jun. 22, 2006

Related U.S. Application Data

(62) Division of application No. 10/218,549, filed on Aug. 14, 2002, now Pat. No. 7,023,508.

(30) Foreign Application Priority Data

Nov. 2, 2001    (KR) ............................... 2001-68150

(51) Int. Cl.
  *G02F 1/1335* (2006.01)
  *G02F 1/136* (2006.01)
(52) U.S. Cl. .................... 349/114; 349/113; 349/43
(58) Field of Classification Search ........ 349/113–114, 349/43
  See application file for complete search history.

(56) References Cited

U.S. PATENT DOCUMENTS

| 4,420,224 A | * | 12/1983 | Kaufmann | 349/113 |
| 5,902,769 A | * | 5/1999 | DeBoer et al. | 503/227 |
| 6,081,310 A | * | 6/2000 | Katsuya et al. | 349/113 |
| 6,344,884 B1 | * | 2/2002 | Kim et al. | 349/43 |
| 6,517,945 B2 | * | 2/2003 | Kishimoto et al. | 428/447 |
| 6,717,632 B2 | * | 4/2004 | Ha et al. | 349/43 |
| 6,839,108 B1 | * | 1/2005 | Hirakata et al. | 349/114 |

FOREIGN PATENT DOCUMENTS

JP    2001133789 A    *  5/2001

* cited by examiner

*Primary Examiner*—Huyen Ngo
(74) *Attorney, Agent, or Firm*—Frank Chau & Associates, LLC

(57) ABSTRACT

A method for manufacturing a liquid crystal display device includes forming a gate pad on a substrate, forming an electrode and a data pad, forming a passivation layer on the electrode and data pad, etching the passivation layer to form first, second, and third contact holes for exposing the electrode, gate pad, and data pad, forming a transparent electrode and simultaneously forming a gate pad electrode and a data pad electrode connected to the gate pad and the data pad through the second and third contact holes, forming a barrier metal layer and a reflective layer on the transparent electrode and the pad electrodes, annealing the reflective layer for preventing lifting of the reflective layer, and patterning the reflective layer and the barrier metal layer to form a reflective electrode and a barrier metal layer pattern on the transparent electrode, wherein the barrier metal layer pattern and the reflective electrode are formed only on the transparent electrode excluding the first contact hole.

14 Claims, 34 Drawing Sheets

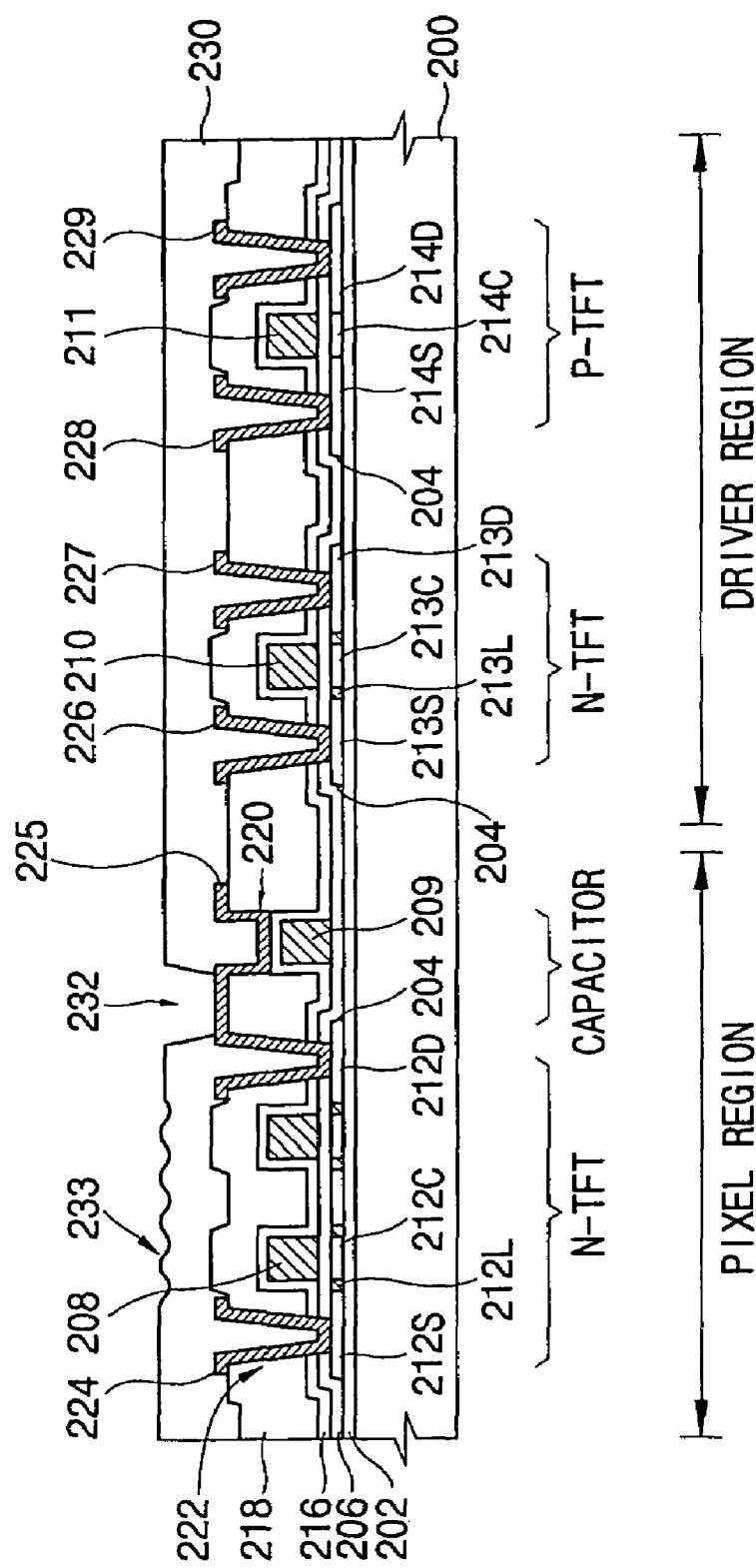

METHOD FOR MANUFACTURING REFLECTION-TRANSMISSION TYPE LIQUID CRYSTAL DISPLAY DEVICE

CROSS-REFERENCE TO RELATED UNITED STATES APPLICATION

This application is a divisional of U.S. patent application Ser. No. 10/218,549, filed on Aug. 14, 2002 now U.S. Pat. No. 7,023,508.

BACKGROUND OF THE INVENTION

1. Field of the Invention

The present invention relates to a reflection-transmission type liquid crystal display device and a method for manufacturing the same, and more particularly to a reflection-transmission type liquid crystal display device and a method for manufacturing the same in which a pad electrode is formed with the same layer as in a transparent electrode to enhance the pad reliability.

2. Description of the Related Art

Among flat panel devices, liquid crystal display (LCD) devices have been widely utilized for various electronic devices because the LCD devices are light, thin, have low power dissipation, and are capable of displaying a high quality image.

LCD devices generally comprise transmission, reflection, and reflection-transmission types. The transmission type LCD device displays information by using a light source such as a backlight. The reflection type LCD device displays information by using natural light. The reflection-transmission type LCD device operates in a transmission mode for displaying an image using a built-in light source when needed, such as in a dark room where a light source is not available, and operates in a reflection mode at other times for displaying the image by reflecting incident light.

At present, thin film transistor-liquid crystal display devices (TFT-LCDs) are widely used. The TFT-LCD has a structure that two substrates respectively having electrodes are provided and a thin film transistor (TFT) for switching a voltage applied to the electrodes is generally formed in a pixel region of one of the substrates.

FIGS. 1A to 1C are cross-sectional views showing a conventional reflection-transmission type liquid crystal display device. In FIGS. 1A to 1C, the reflection-transmission type liquid crystal display device is an amorphous silicon type TFT-LCD having a bottom-gate structure. FIG. 1A shows a display region of the liquid crystal display device where a thin film transistor 15 is formed. FIG. 1B and FIG. 1C show a gate pad region and a data pad region of the liquid crystal display device, respectively.

Referring to FIGS. 1A to 1C, after depositing a first metal layer on a substrate 10 composed of insulating material such as glass, quartz, or sapphire, the first metal layer is patterned by a photolithography process using a first mask to form a gate wiring. The gate wiring includes a gate line (not shown) extending in a first direction, a gate electrode 12 branched from the gate line and a gate pad 11 connected to the end of the gate line for applying a scanning voltage to the gate electrode 12.

A gate insulation layer 14 composed of silicon nitride is formed on the substrate 10 on which the gate wiring is formed, and then, an amorphous silicon layer and an $n^+$ doped amorphous silicon layer are successively formed on the gate insulation layer 14. Subsequently, the amorphous silicon layer and the $n^+$ doped amorphous silicon layer are patterned by a photolithography process using a second mask to form an active pattern 16 and an ohmic contact pattern 18. Thus, the active pattern 16 is composed of amorphous silicon and the ohmic contact pattern 18 is made of $n^+$ doped amorphous silicon.

After depositing a second metal layer on the ohmic contact pattern 18 and the gate insulation layer 14, the second metal layer is patterned through a photolithography process using a third mask to form a data wiring. The data wiring includes a data line (not shown) extended in a second direction perpendicular to the first direction, source/drain electrodes 20 and 22 branched from the data line and a data pad connected to the end of the data line for applying an image voltage to the source electrode 20.

Then, a portion of the ohmic contact pattern 18 exposed between the source electrode 20 and the drain electrode 22 is dry-etched away to form a channel region of the thin film transistor.

After forming an inorganic passivation layer 25 on the data wiring and the gate insulation layer 14, a portion of the inorganic passivation layer 25 on the drain electrode 22 is removed by a photolithography process using a fourth mask. Here, pad contact holes 33 and 35 exposing the gate pad 11 and the data pad 19 are simultaneously formed.

After forming an organic passivation layer 26 on the entire surface of the resultant structure, a portion the organic passivation layer 26 on the drain electrode 22 and the pad regions is removed by exposure and develop processes using a fifth mask, thereby forming a first contact hole 28 exposing the drain electrode 22. At the same time, a plurality of grooves for scattering a light are formed in the surface of the organic passivation layer 26 using a sixth mask. That is, the first contact hole 28 and the grooves are simultaneously formed by two exposure processes using two masks and by one developing process.

After depositing a transparent conductive layer composed of indium tin oxide (ITO) or indium zinc oxide (IZO) on the resultant structure, the transparent conductive layer is patterned by a photolithography process using a seventh mask, thereby forming a transparent electrode 30 connected to the drain electrode 22 through the first contact hole 28.

A buffer layer 32 composed of inorganic material such as silicon nitride is formed on the entire surface of the resultant structure including the transparent electrode 30, and then, the buffer layer 32 is etched away by a photolithography process using an eighth mask to form a second contact hole 34 partially exposing the drain electrode 22.

After depositing a reflective layer composed of metal having high reflectivity such as aluminum-neodymium (Al—Nd) on the second contact hole 34 and the buffer layer 32, the reflective layer is patterned by photolithography process using a ninth mask to form a reflective electrode 36 connected to the drain electrode 22 through the second contact hole 34. The reflective electrode 36 has a transmission window $T_1$ exposing the underlying transparent electrode 30. At the same time, a gate pad electrode 38 and a data pad electrode 40 are formed. The gate pad electrode 38 and the data pad electrode 40 are connected to the gate pad 11 and the data pad 19, respectively.

According to the conventional method, the reflection-transmission type amorphous silicon type thin film transistor-liquid crystal display device is manufactured using nine masks. At that time, the buffer layer 32 composed of silicon nitride is formed between the transparent electrode 30 and the reflective electrode 36 to prevent a galvanic corrosion generated due to a direct contact between the transparent electrode 30 and the reflective electrode 36. In particular, when the transparent electrode 30 is a bottom layer of a multilayered pixel electrode, an insulation layer should be interposed between the transparent electrode 30 and the reflective electrode 36 so as to prevent the reflective electrode 36 from being lifted due to a voltage difference between the transparent electrode 30 and the reflective electrode 36 during the development of a photoresist layer for patterning the reflective electrode 36. Hence, the manufacturing process is more complicated because an additional photolithography process is needed for etching the insulating layer to form the contact hole connecting the reflective electrode 36 to the thin film transistor.

Also, the buffer layer 32 must be formed by a low temperature chemical vapor deposition (CVD) method since the buffer layer 32 is positioned over the organic passivation layer 26. Furthermore, metals may be corroded during a subsequent chip on glass (COG) bonding process because the pad electrodes 38 and 40 are formed from the same layer as in the reflective electrode 36.

In the pixel electrode having the transparent electrode as the bottom electrode, the buffer layer can be formed by using organic material instead of using silicon nitride to prevent the metal corrosion and the lifting of the reflective electrode. However, such process is complicated since at least one mask is required for patterning the buffer layer. In addition, a reflectivity of the reflective electrode is decreased and the buffer layer is hardly patterned because the organic buffer layer is positioned over the organic passivation layer. Furthermore, metals are corroded during subsequent COG bonding process since the pad electrodes and the reflective electrode are formed from the same layer.

FIGS. 2A to 2C are cross-sectional views illustrating another conventional reflection-transmission type liquid crystal display device. In FIGS. 2A to 2C, the reflection-transmission type liquid crystal display device has a structure in which a transparent electrode is directly contacted with a reflective electrode. FIG. 2A shows a display region of the liquid crystal display device where a thin film transistor 55 is formed. FIG. 2B and FIG. 2C show a gate pad region and a data pad region of the liquid crystal display device, respectively.

Referring to FIGS. 2A to 2C, after depositing a first metal layer on a substrate 50 composed of insulating material such as glass, the first metal layer is patterned by a photolithography process using a first mask to form a gate wiring. The gate wiring includes a gate line (not shown) extended in a first direction, a gate electrode 52 branched from the gate line and a gate pad 51 connected to the end of the gate line for applying a scanning voltage to the gate electrode 52.

A gate insulation layer 54 composed of silicon nitride is formed on the substrate 50 on which the gate wiring is formed, and then, an amorphous silicon layer and an n+ doped amorphous silicon layer are successively formed on the gate insulation layer 54. Subsequently, the amorphous silicon layer and the n+ doped amorphous silicon layer are patterned by a photolithography process using a second mask to form an active pattern 56 composed of amorphous silicon and an ohmic contact pattern 58 composed of n+ doped amorphous silicon.

After depositing a second metal layer on the ohmic contact pattern 58 and the gate insulation layer 54, the second metal layer is patterned by a photolithography process using a third mask to form a data wiring. The data wiring includes a data line (not shown) extended in a second direction perpendicular to the first direction, source/drain electrodes 60 and 62 branched from the data line and a data pad connected to the end of the data line for applying a image voltage to the source electrode 60. Successively, a portion of the ohmic contact pattern 58 exposed between the source electrode 60 and the drain electrode 62 is dry-etched away to form a channel region of the thin film transistor.

After forming an inorganic passivation layer 65 on the data wiring and the gate insulation layer 54, a portion of the inorganic passivation layer 65 on the drain electrode 62 is removed by a photolithography process using a fourth mask. Here, pad contact holes 69 and 71 for exposing the gate pad 51 and the data pad 59 are formed at the same time. After forming an organic passivation layer 66 on the entire surface of the resultant structure, the organic passivation layer 66 is patterned by an exposure process and a develop process using a fifth mask and a sixth mask, thereby simultaneously forming a contact hole 68 exposing the drain electrode 62 and a plurality of grooves.

After depositing a reflective layer composed of metal having high reflectivity such as aluminum-neodymium (Al—Nd) on the resultant structure, the reflective layer is patterned by photolithography process using a seventh mask to form a reflective electrode 70, a gate pad electrode 74, and a data pad electrode 76. The reflective electrode 70 is connected to the drain electrode 62 through the contact hole 68. The gate pad electrode 74 and the data pad electrode 76 are connected to the gate pad 51 and the data pad 59 through the contact holes 69 and 71, respectively.

Subsequently, after depositing a transparent conductive layer composed of IZO on the reflective electrode 70, the transparent conductive layer is patterned by a photolithography process using an eighth mask to form a transparent electrode 72 being directly in contact with the reflective electrode 70. Here, a region having the transparent electrode 72 and not having the reflective electrode 70 forms a transmission window $T_2$.

According to the above-described method, one mask can be omitted during the manufacturing process in comparison with the conventional method of FIG. 1 because the transparent electrode 72 is directly in contact with the reflective electrode 70 without a buffer layer. Also, the lifting of the reflective electrode 70 cannot occur since the transparent electrode 72 is positioned as a top layer. However, a galvanic corrosion between the reflective electrode 70 and the transparent electrode 72 is generally developed. Further, when the transparent electrode 72 is composed of IZO, the transparent electrode 72 and the reflective electrode 70 are not simultaneously patterned because the IZO reacts with an aluminum etchant or a chrome etchant. In addition, the transparent electrode 72 should be positioned as the top electrode to directly contact with the reflective electrode 70 and the transparent electrode 72.

SUMMARY OF THE INVENTION

The present invention solves the aforementioned problems, and accordingly, it is one object of the present invention to provide a liquid crystal display device in which a transparent electrode makes direct contact with a reflective electrode to simplify the manufacturing process and a pad electrode is formed of a transparent conductive layer for the transparent electrode to enhance the pad reliability.

It is another object of the present invention to provide a method for manufacturing a liquid crystal display device in which a transparent electrode makes direct contact with a reflective electrode to simplify the manufacturing process and a pad electrode is formed of a transparent conductive layer for the transparent electrode to enhance the pad reliability.

To achieve one object of the present invention, there is provided a liquid crystal display device comprising a substrate having a display region on which pixels are formed and a pad region located in a periphery of the display region, the display region having a transparent electrode, the pad region having a pad electrode, the transparent electrode and the pad electrode formed from the same layer; and a reflective electrode formed on the transparent electrode and having a transmission window exposing a portion of the transparent electrode.

According to a preferred embodiment of the present invention, a barrier metal layer having a shape identical to that of the reflective electrode is formed between the transparent electrode and the reflective electrode.

The barrier metal layer is included of material having an etching rate substantially the same as an etching rate of the reflective electrode. The pixel includes an amorphous silicon type thin film transistor. The pixel includes a polysilicon type thin film transistor. The transparent electrode is included of indium tin oxide (ITO), the reflective electrode is included of aluminum-neodymium (Al—Nd), and the barrier metal layer pattern is included of molybdenum-tungsten (Mo—W).

Further, to achieve one object of the present invention, there is also provided a liquid crystal display device comprising a substrate having a display region and a pad region located in a periphery of the display region; a thin film transistor (TFT) formed on the substrate of the display region, the TFT including a gate electrode, first and second electrodes and an active pattern; a passivation layer formed on the TFT and the substrate, the passivation layer having a hole exposing the second electrode; a transparent electrode formed on the passivation layer of the display region; a pad electrode formed on the passivation layer of the pad region, the pad electrode formed from the same layer of the transparent electrode; a reflective electrode formed on the transparent electrode and having a transmission window exposing a portion of the transparent electrode; and a barrier metal layer pattern formed between the transparent electrode and the reflective electrode and having a shape identical to that of the reflective electrode.

According one aspect of the present invention, the transparent electrode is formed on the hole and the passivation layer so as to be connected to the second electrode through the hole.

According to another aspect of the present invention, the transparent electrode is formed only on the passivation layer except for the hole, and the barrier metal layer pattern and the reflective electrode are formed on the hole and the transparent electrode so as to be connected to the second electrode through the hole.

According to further another aspect of the present invention, the barrier metal layer pattern and the reflective electrode are formed only on the transparent electrode except for the hole.

To achieve another object of the present invention, there is provided a method for manufacturing a liquid crystal display device including the steps of forming a transparent conductive layer on a substrate having a display region and a pad region located in a periphery of the display region, forming a reflective layer on the substrate having the transparent conductive layer, annealing the reflective layer to prevent the reflective layer from being lifted, and patterning the reflective layer to form a reflective electrode.

According to an embodiment of the present invention, an argon (Ar) plasma process is performed to enhance the adhesion between the transparent conductive layer and the underlying layer. The method further includes the step of patterning the transparent conductive layer to form a transparent electrode on the display region and a pad electrode on the pad region, before the step of forming the reflective layer. The method further includes the steps of annealing the transparent conductive layer for pattern uniformity of the transparent conductive layer, and hard-baking the transparent conductive layer for increasing the adhesion of the transparent conductive layer, before the step of patterning the transparent conductive layer.

The method further includes the step of patterning the transparent conductive layer to form a transparent electrode on the display region and a pad electrode on the pad region, after the step of forming the reflective electrode. The reflective electrode, the transparent electrode, and the pad electrode are formed using one mask. The mask is a half-tone mask or a slit mask. The step of annealing the reflective layer is performed at a temperature above about 100° C. for more than about 30 minutes.

The method further includes the step of forming a barrier metal layer before the step of forming the reflective layer. When patterning the reflective layer, the barrier metal layer is patterned at the same time to form a barrier metal layer pattern.

The transparent conductive layer, the barrier metal layer, and the reflective layer are formed at a temperature of about 20° C. to about 150° C. The barrier metal layer is included of material having an etching rate similar to an etching rate of the reflective layer. The transparent conductive layer is included of indium-tin-oxide (ITO), the barrier metal layer is included of molybdenum-tungsten (MoW), and the reflective layer is included of aluminum-neodymium (AlNd).

According to one embodiment on the present invention, there is provided a method for manufacturing a liquid crystal display device including the steps of forming a gate electrode on a display region of a substrate and a gate pad on a pad region of the substrate located in a periphery of the display region, forming a gate insulation layer so as to cover the gate electrode and the gate pad, forming an active pattern and an ohmic contact pattern on the gate insulation layer, forming a first electrode and a second electrode on the ohmic contact pattern and simultaneously forming a data pad on the gate insulation layer in the pad region, forming a passivation layer on the first and second electrodes, the data pad and the gate insulation layer, etching the passivation layer to form first, second and third contact holes for exposing the second electrode, the gate pad and the data pad, respectively, forming a transparent electrode on the display region and simultaneously forming a gate pad electrode and a data pad electrode for contacting to the gate pad and the data pad through the second and third contact holes, respectively, successively forming a barrier metal layer and a reflective layer on the transparent electrode and the pad electrodes, annealing the reflective layer for preventing a lifting of the reflective layer, and patterning the reflective layer and the barrier metal layer to form a barrier metal layer pattern and a reflective electrode.

According to another embodiment of the present invention, there is also provided a method for manufacturing a liquid crystal display device including the steps of forming an active pattern on a substrate, forming a gate insulation layer on the substrate having the active pattern, forming a gate electrode on the gate insulation layer where the active pattern is formed, successively forming first and second interlayer dielectric layers on the gate electrode and the gate insulation layer, etching the first and second interlayer dielectric layers and the gate insulating layer to form contact holes for respectively exposing first and second regions of the active pattern, forming first and second electrodes respectively connecting to the first and second regions through the contact holes, forming a passivation layer on the first and second electrode and the second interlayer dielectric layer having the first and second electrodes, etching the passivation layer to form a via hole for exposing the second electrode, forming a transparent electrode on the passivation layer, successively forming a barrier metal layer and a reflective layer on the transparent electrode, annealing the reflective layer for preventing the reflective layer from being lifted, and patterning the reflective layer and the barrier metal layer to form a barrier metal layer pattern and a reflective electrode on the transparent electrode.

According to the present invention, a multilayered pixel electrode of the liquid crystal display device has a structure in which the transparent electrode is formed as the lower layer and the transparent electrode is in direct contact with the reflective layer. Preferably, in order to prevent the galvanic corrosion from being generated between the transparent electrode and the reflective electrode, the barrier metal layer pattern having the etching rate identical to that of the reflective electrode is interposed between the transparent electrode and the reflective electrode. Therefore, the manufacturing process can be simplified by reducing at least one mask in comparison with the conventional method in which the buffer layer is formed between the transparent electrode and the reflective electrode. Also, the manufacturing process can be more simplified because the pixel electrode is formed using one mask when the half-tone mask or the slit mask is utilized.

In addition, after depositing the reflective layer, the annealing of the reflective layer is performed at a temperature of about 200° C. for about 1 to about 2 hours to thereby prevent the lifting of the reflective electrode in the pixel electrode having the transparent electrode as the bottom layer.

Furthermore, the pad electrodes are formed of the same layer as the transparent electrode composed of a conductive oxide layer, so that the pad reliability can increase without the metal corrosion during COG bonding process.

BRIEF DESCRIPTION OF THE DRAWINGS

The above and other objects and advantages of the present invention will become readily apparent by reference to the following detailed description when considered in conjunction with the accompanying drawings wherein:

FIGS. 14A to 14G are cross-sectional views illustrating a method for manufacturing the reflection-transmission type liquid crystal display device according to the fourth embodiment of the present invention;

DETAILED DESCRIPTION OF PREFERRED EMBODIMENTS

Hereinafter, a liquid crystal display device and a method for manufacturing the liquid crystal display device according to preferred embodiments of the present invention will be described in detail with reference to the accompanying drawings.

Embodiment 1

Figure 1A:
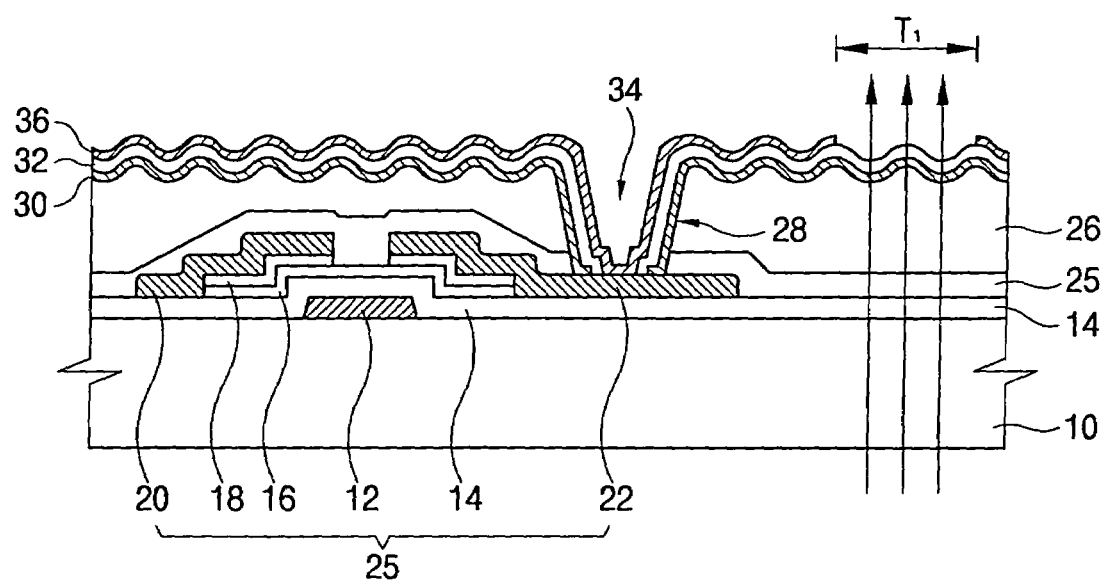
FIGS. 1A to 1C are cross-sectional views showing a conventional reflection-transmission type liquid crystal display device.
Figure 1B:
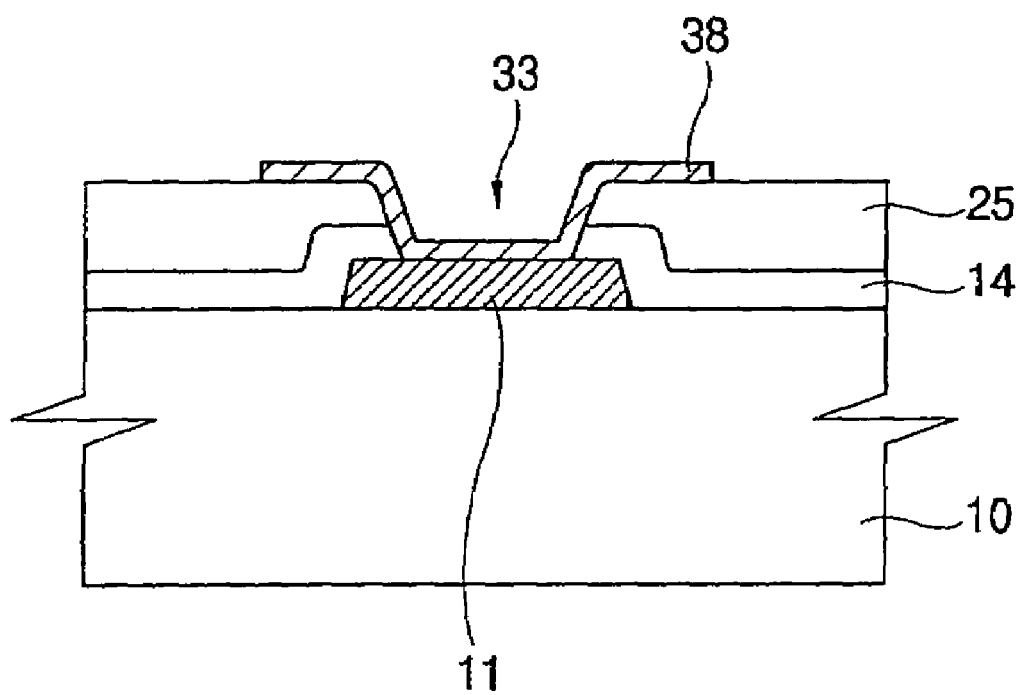
Figure 1C:
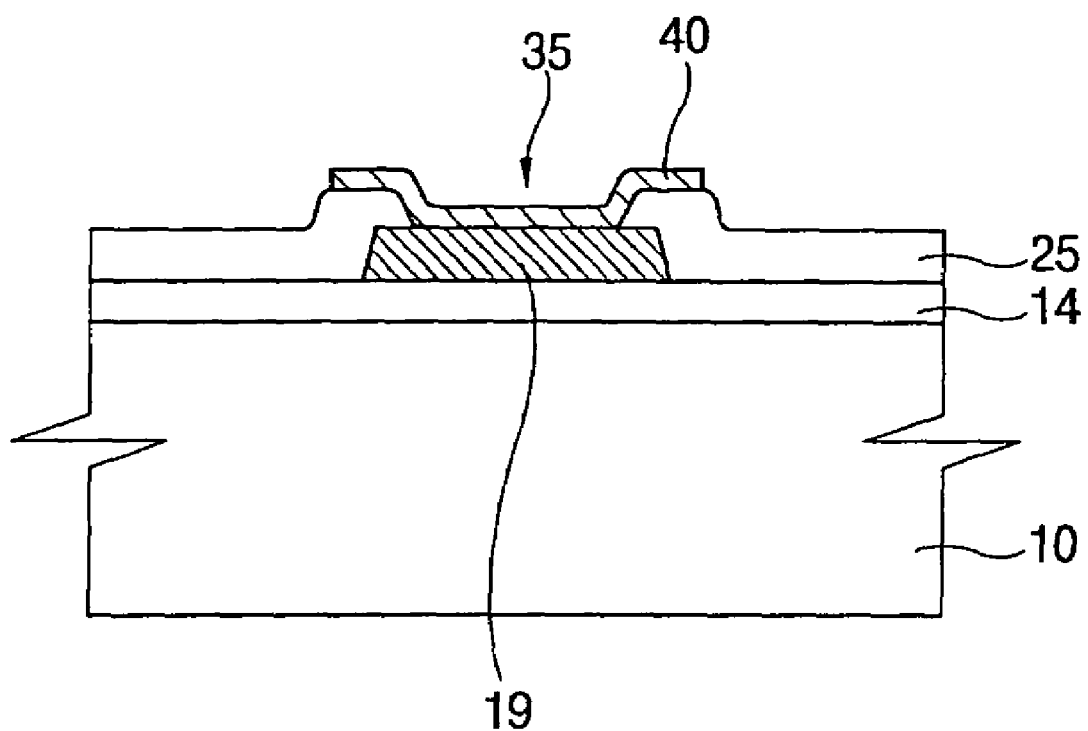
Figure 2A:
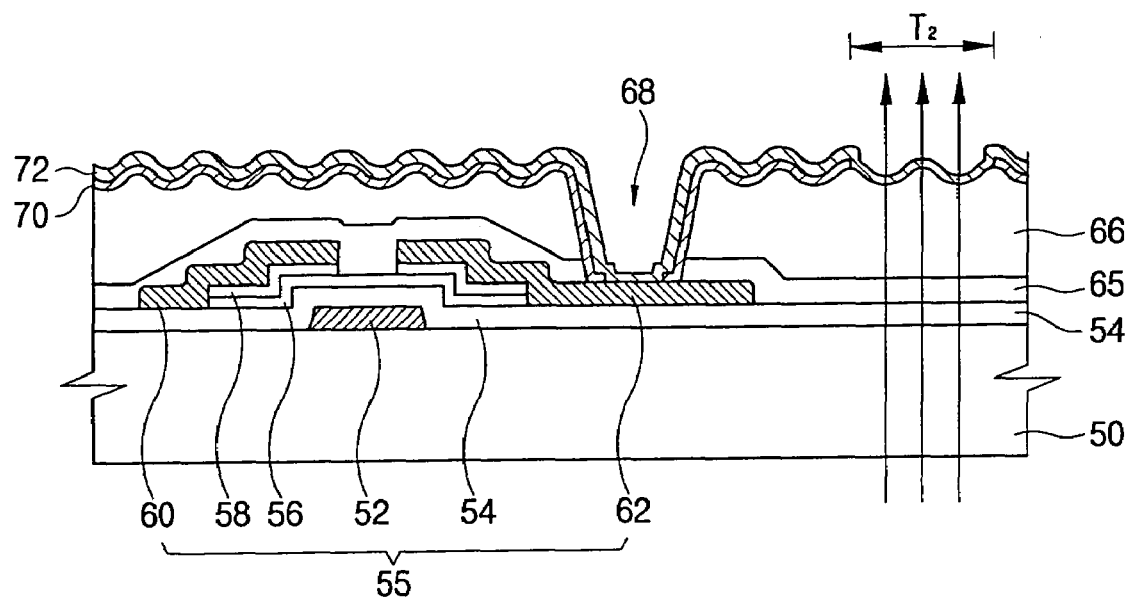
FIGS. 2A to 2C are cross-sectional views showing another conventional reflection-transmission type liquid crystal display device.
Figure 2B:
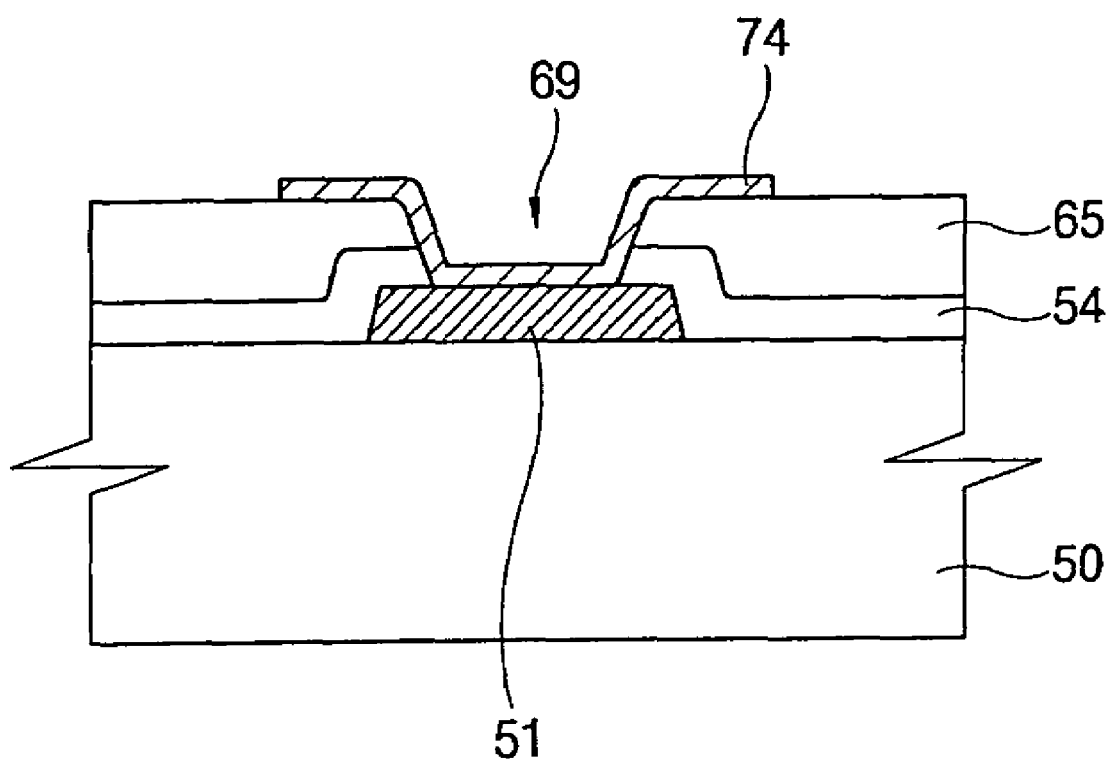
Figure 2C:
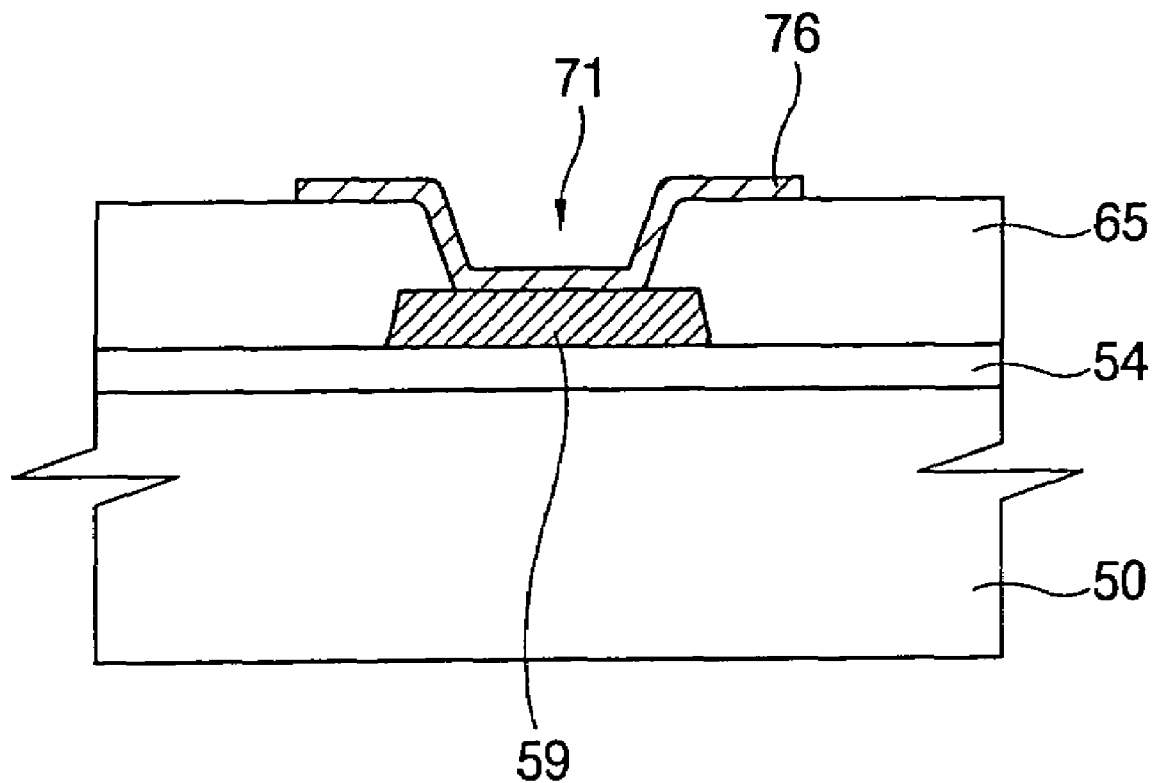
Figure 3B:
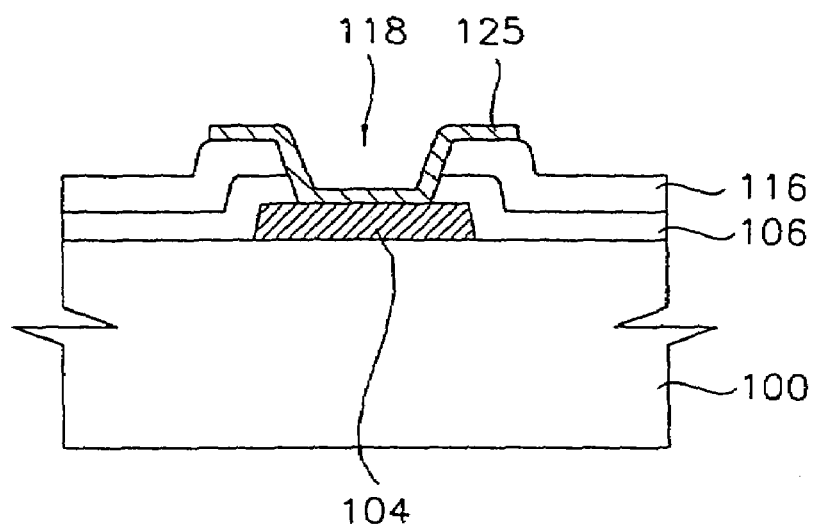
FIGS. 3A to 3C are cross-sectional views showing a reflection-transmission type liquid crystal display device according to a first embodiment of the present invention.
Figure 3C:
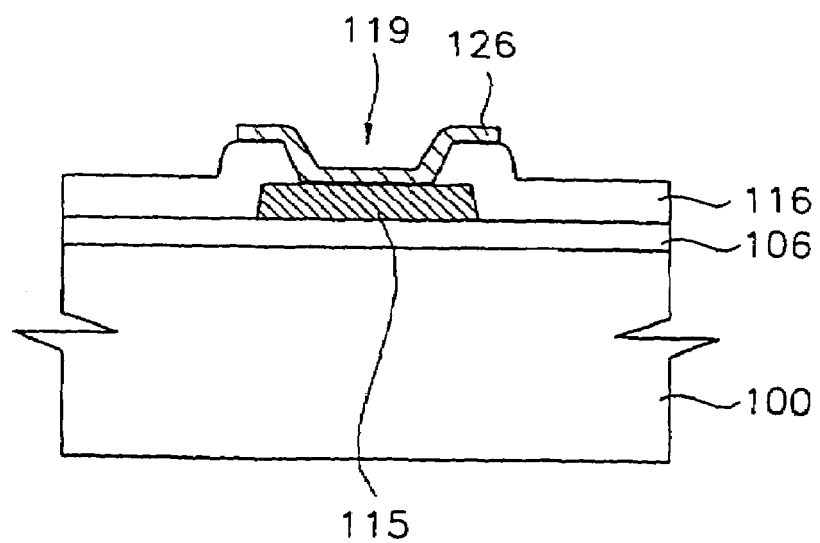
Figure 3A:
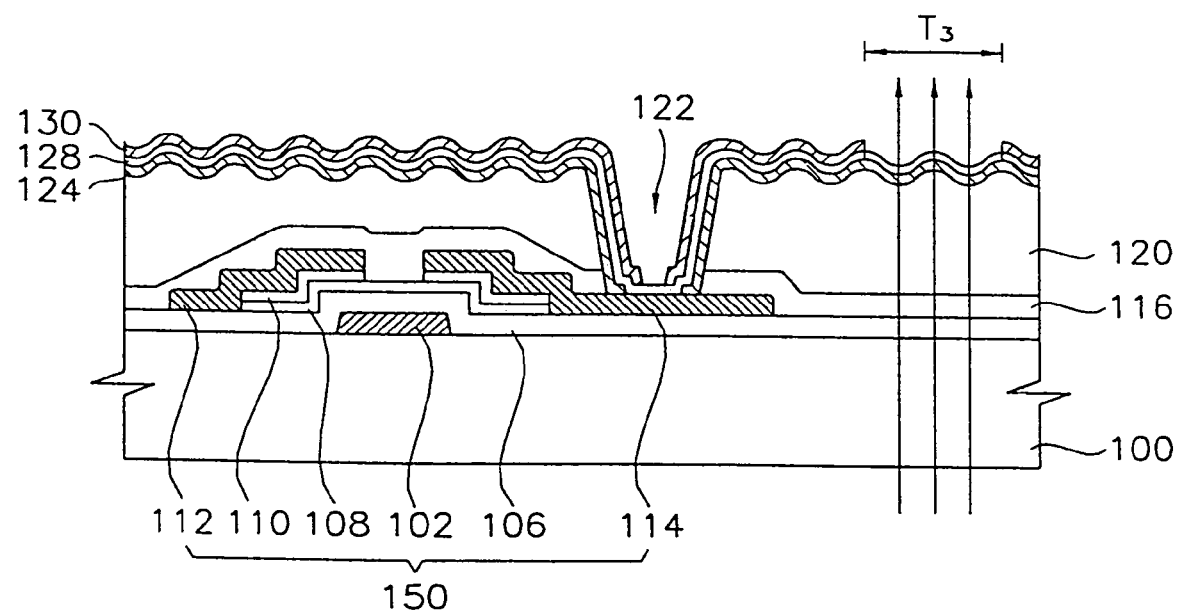

FIGS. 3A to 3C are cross-sectional views showing a reflection-transmission type liquid crystal display device according to a first embodiment of the present invention. The liquid crystal display device in FIGS. 3A to 3C includes an amorphous silicon type thin film transistor having a bottom-gate structure. FIG. 3A illustrates a display region where the thin film transistor is formed. FIGS. 3B and 3C show a gate pad region and a data pad region, respectively.

Referring to FIGS. 3A to 3C, a gate wiring composed of a first metal layer such as chrome (Cr) or aluminum-neodymium (Al—Nd) is formed on an insulation substrate 100 made of glass, quartz, or sapphire. The gate wiring includes a gate line (not shown) extended in a first direction, a gate electrode 102 of a thin film transistor 150 branched from the gate line, and a gate pad 104 connected to the end of the gate line for applying a scanning voltage to the gate electrode 102.

A gate insulation layer 106 is formed on the gate wiring and the substrate 100. The gate insulation layer 106 is comprised of inorganic material such as silicon nitride.

An active pattern 108 and an ohmic contact pattern 110 are successively formed on the gate insulation layer 106 where the gate electrode 102 is located. The active pattern 108 is comprised of amorphous silicon and the ohmic contact pattern 110 is comprised of an $n^+$ doped amorphous silicon.

Further, a data wiring made of a second metal layer such as chrome (Cr) or aluminum (Al) is formed on the gate insulation layer 106. The data wiring includes a data line (not shown) extended in a second direction perpendicular to the first direction, first and second electrodes 112 and 114, and a data pad 115 connected to the end of the data line for applying an image voltage to the first electrode 112. The first electrode 112 (source electrode or drain electrode) is branched from the data line and overlapped with a first region of the active pattern 108. The second electrode 114 (drain electrode or source electrode) is overlapped with a second region that is opposite to the first region. Hereinafter, the first electrode 112 is referred to as the "source electrode" and the second electrode 114 is referred to as the "drain electrode".

Thus, on the display region of the substrate 100, there is formed the thin film transistor 150 comprising the gate electrode 102, the gate insulation layer 106, the active pattern 108, the ohmic contact pattern 110, the source electrode 112, and the drain electrode 114.

An inorganic passivation layer 116 comprised of silicon nitride and an organic passivation layer 120 comprised of acrylic resin are successively formed on the data wiring and the gate insulation layer 106. The inorganic passivation layer 116 is provided to maintain the reliability of the transistor and pads and to enhance the strength of COG bonding. The organic passivation layer 120 preferably is formed on the display region.

A first contact hole 122 is formed through the inorganic passivation layer 116 and the organic passivation layer 120 over the drain electrode 114. Another electrode such as pixel electrode can form on the inorganic passivation layer 116 to contact and make connection with the drain electrode 114 through the first contact hole 122.

Also, a second contact hole 118 and a third contact hole 119 are formed through the inorganic passivation layer 116 and the gate insulation layer 106 over the gate pad 104 and the data pad 115. Then, a gate pad electrode 125 and a data pad electrode 126 are formed so as to make direct contact with the gate pad 104 and the data pad 115 through the second contact hole 118 and the third contact hole 119, respectively.

The pixel electrode is formed of a stacked structure in which a transparent electrode 124 and a reflective electrode 130 are located in a pixel region defined by the gate line and the data line. The transparent electrode 124 is comprised of a conductive oxide such as indium tin oxide (ITO), and the reflective electrode 130 is comprised of a reflective metal such as aluminum-neodymium (Al—Nd). The pixel electrode receives an image signal from the thin film transistor 150 to generate an electric field with an electrode of a color filter substrate (not shown). In this case, a region where the reflective electrode 130 is located over the transparent electrode 124 functions as a reflection window, and a region where only transparent electrode 124 is positioned functions as a transmission window $T_3$.

According to an embodiment of the present invention, a barrier metal layer pattern 128 is further formed between the transparent electrode 124 and the reflective electrode 130 so as to prevent forming the galvanic corrosion. The barrier metal layer pattern 128 is comprised of a metal having an etching rate similar to that of the reflective electrode 130 with respect to a predetermined etchant for etching the reflective electrode 130. Preferably, the barrier metal layer 128 is comprised of molybdenum-tungsten (Mo—W) and is patterned to have a shape identical to that of the reflective electrode 130.

According to conventional methods in which the buffer layer composed of silicon nitride or organic material is formed between the transparent electrode and the reflective electrode, in case that the transparent electrode is below the reflective electrode, an additional photolithography process is needed for etching the buffer layer to form a contact hole connecting the reflective electrode to the drain electrode. Thus, the manufacturing process is more complicated. Advantageously, according to the present embodiment of the invention, the barrier metal layer pattern 128 comprised of a metal is formed between the transparent electrode 124 and the reflective electrode 130 so that the transparent electrode 124 is electrically connected to the reflective electrode 130. Hence, at least one photolithography process can be reduced in comparison with the conventional method because a process for forming a contact hole connecting the reflective electrode 130 to the drain electrode 114 is eliminated.

Also, according to the present embodiment, the gate pad electrode 125 and the data pad electrode 126 are formed from the same layer as in the transparent electrode 124. In the conventional method, the pad electrodes are formed from the same layer as in the reflective electrode composed of a metal so that metal corrosion is generated when the pad electrodes of the LCD panel are connected to the external driver integrated circuits (ICs) via the COG method, thereby deteriorating pad reliability.

However, in the present embodiment, the pad electrodes 125 and 126 are not corroded during the COG bonding because the pad electrodes 125 and 126 are formed of the same layer as the transparent electrode 124 comprised of the conductive oxide, thereby enhancing pad reliability.

FIGS. 4A to 10C are cross-sectional views illustrating a method for manufacturing the reflection-transmission type liquid crystal display device according to the first embodiment of the present embodiment. FIGS. 4A, 5A, 6A, 7A, 8A, 9A, and 10A show the display region where the thin film transistor is formed. FIGS. 4B, 5B, 6B, 7B, 8B, 9B, and 10B show the gate pad 104 region, and FIGS. 4C, 5C, 6C, 7C, 8C, 9C, and 10C show the data pad region.

Figure 4A:
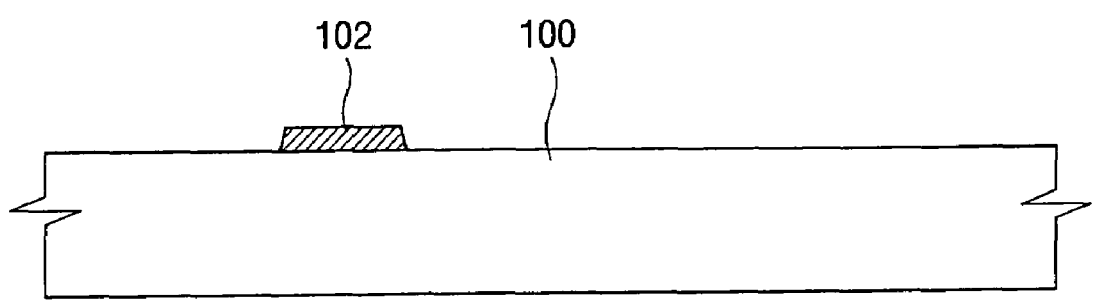
FIGS. 4A to 10C are cross-sectional views illustrating a method for manufacturing the reflection-transmission type liquid crystal display device according to the first embodiment of the present invention.
Figure 4B:
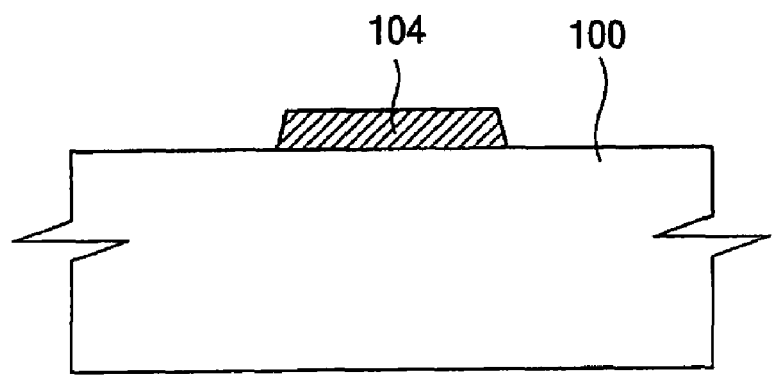
Figure 4C:
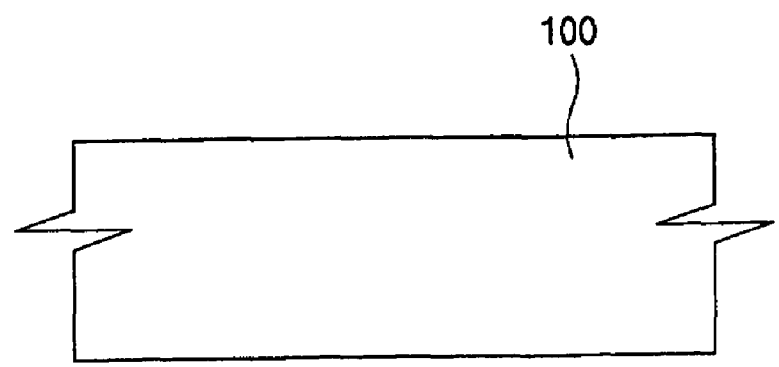

Referring to FIGS. 4A to 4C, after depositing a first metal layer on a substrate 100 comprised of insulation material such as glass, quartz or ceramic, the first metal layer is patterned by a photolithography process using a first mask to form a gate wiring. The first metal layer includes chrome (Cr) having a thickness of about 500 Å and aluminum-neodymium (Al—Nd) having a thickness of about 2500 Å. The gate wiring includes a gate line (not shown) extended in a first direction, a gate electrode 102 branched from the gate line, and a gate pad connected to the end of the gate line for applying a scanning voltage to the gate electrode 102. At that time, a sidewall of the gate electrode 102 preferably has a tapered profile.

Figure 5A:
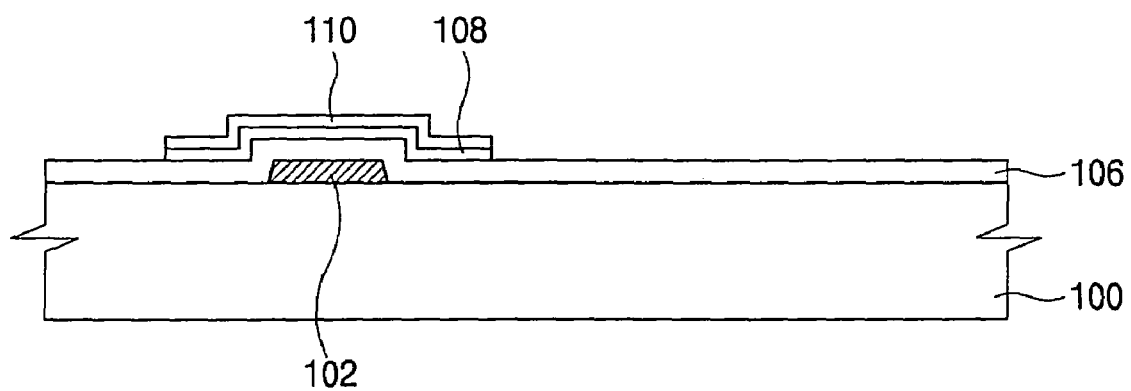
Figure 5B:
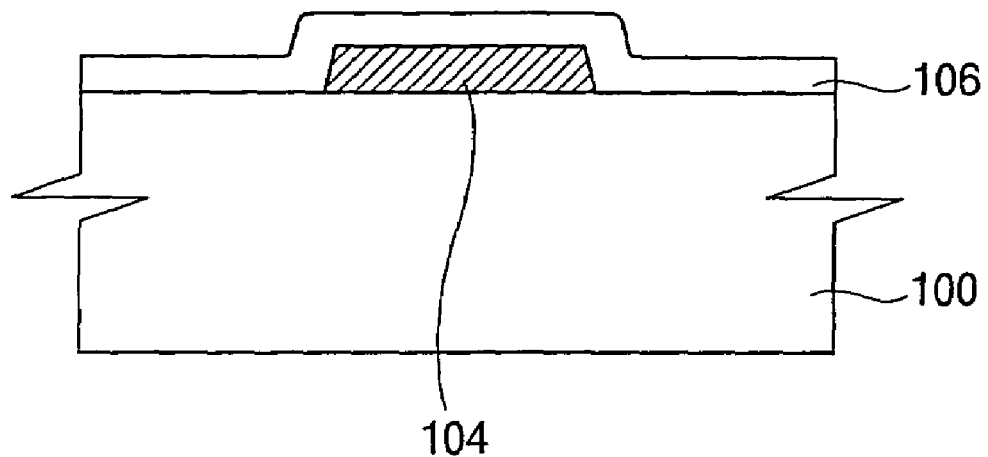
Figure 5C:
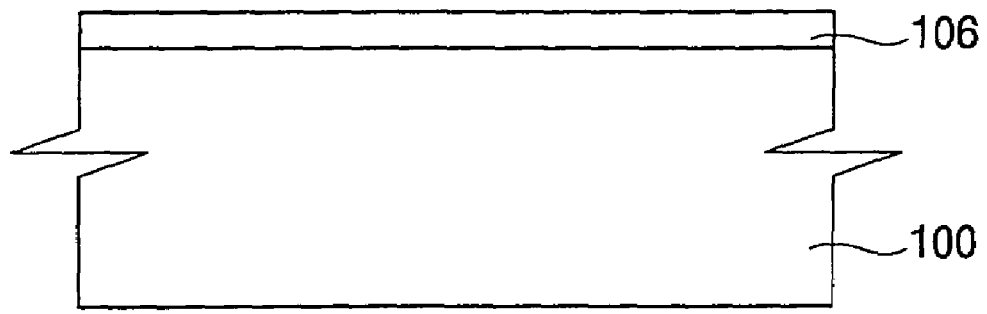

Referring to FIGS. 5A to 5C, silicon nitride is deposited to a thickness of about 4500 Å by a plasma-enhanced chemical vapor deposition (PECVD) method on the entire surface of the substrate 100 on which the gate wiring is formed, thereby forming a gate insulating layer 106.

An active layer, e.g., an amorphous silicon layer, is deposited to a thickness of about 2000 Å by the PECVD method on the gate insulation layer 106, and then, an ohmic contact layer, e.g., an $n^+$ doped amorphous silicon layer, is deposited to a thickness of about 500 Å by the PECVD method on the active layer. Next, the active layer and the ohmic contact layers are patterned by a photolithography process using a second mask to form an active pattern 108 and an ohmic contact pattern 110, respectively. The active pattern 108 remains on the gate insulation layer 106 where the gate electrode 102 is located.

Figure 6A:
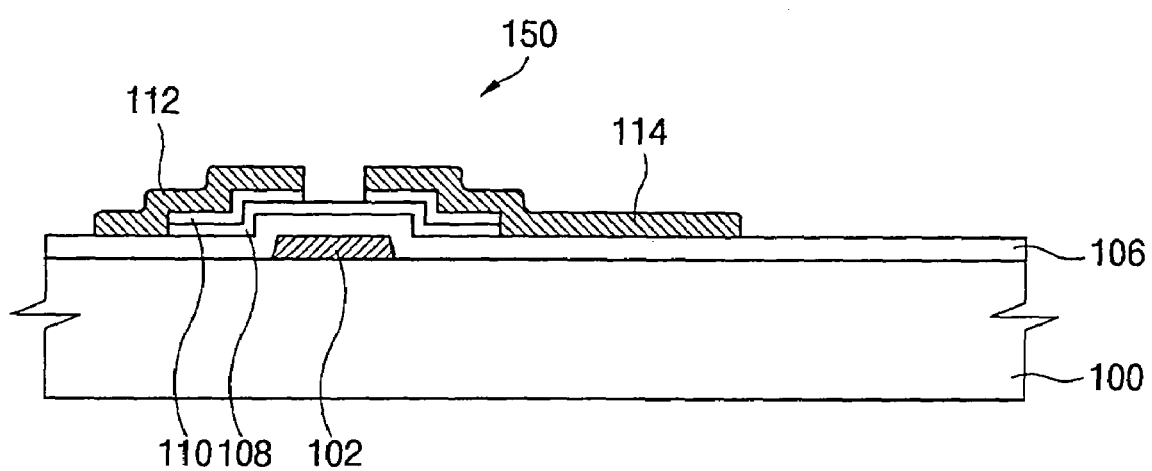
Figure 6B:
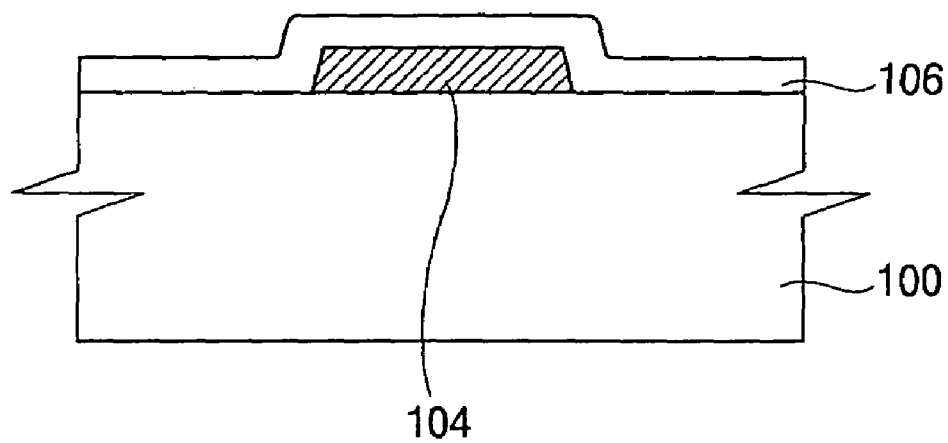
Figure 6C:
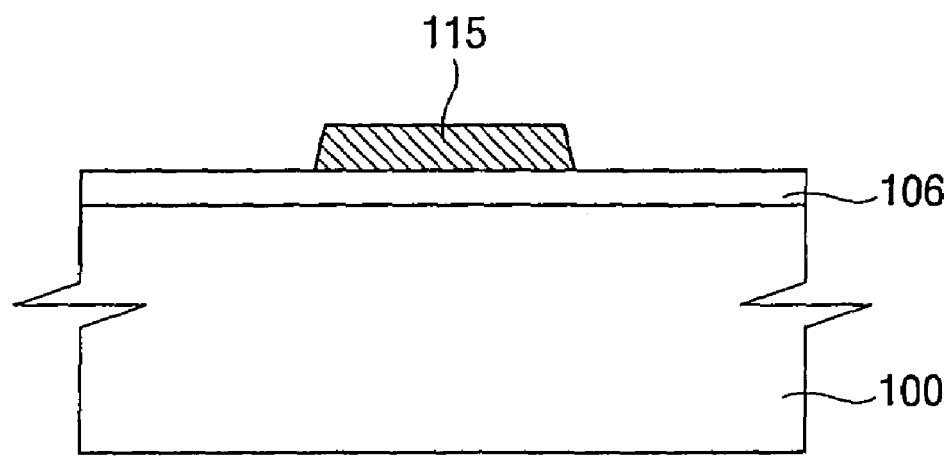

Referring to FIGS. 6A to 6C, after depositing a second metal layer to a thickness of about 1500 to about 4000 Å on the ohmic contact pattern 110 and the gate insulation layer 106, the second metal layer is patterned by a photolithography process using a third mask to form a data wiring. The second metal layer is comprised of chrome (Cr), chrome-aluminum (Cr—Al) or chrome-aluminum-chrome (Cr—Al—Cr). The data wiring includes a data line (not shown) extended in a second direction perpendicular to the first direction, source/drain electrodes 112 and 114 branched from the data line, and a data pad 115 connected to the end of the data line for applying an image voltage to the source electrode 112.

Subsequently, the ohmic contact pattern 110 exposed between the source electrode 112 and the drain electrode 114 is removed by a reactive ion etching (RIE) method, so an active region exposed between the source electrode 112 and the drain electrode 114 serves as a channel region of the thin film transistor 150. At that time, the gate insulation layer 106 is interposed between the gate line and the data line, thereby preventing the gate line and the data line from making contact with each other.

In the present embodiment, the active pattern 108, the ohmic contact pattern 110 and the data wiring are formed using two masks. However, the active pattern 108, the ohmic contact pattern 110, and the source/drain electrode 112/114 can be formed by using one mask as described in Korean Patent Application No. 1998-49710, thereby reducing the number of masks for manufacturing a thin film transistor-liquid crystal display device having the bottom-gate structure. The method for manufacturing such thin film transistor-liquid crystal display device is described as follows using the same reference numerals concerning elements identical to the present embodiment.

At first, an active layer, an ohmic contact layer and a second metal layer are successively deposited on a gate insulation layer 106. After a photoresist layer is coated on the second metal layer, the photoresist layer is patterned by exposure and developing processes to form a photoresist pattern (not shown) including a first portion, a second portion, and a third portion. The first portion has a first thickness and is formed on a channel region of the thin film transistor. The second portion has a second thickness thicker than that of the first portion and is formed on a region where a data wiring will be formed. The third portion is a region where no photoresist layer remains.

Then, the second metal layer, ohmic contact layer and active layer under the third portion, the second metal layer under the first portion, and a partial thickness of the second portion are etched away to simultaneously form the data wiring composed of the second metal layer, an ohmic contact pattern 110 composed of the n+ amorphous silicon layer and an active pattern 108 composed of amorphous silicon layer. Next, the remaining photoresist patterns are removed. By doing so, the active pattern 108, the ohmic contact pattern 110 and the source/drain electrode 112/114 are formed at the same time using one mask.

Figure 7A:
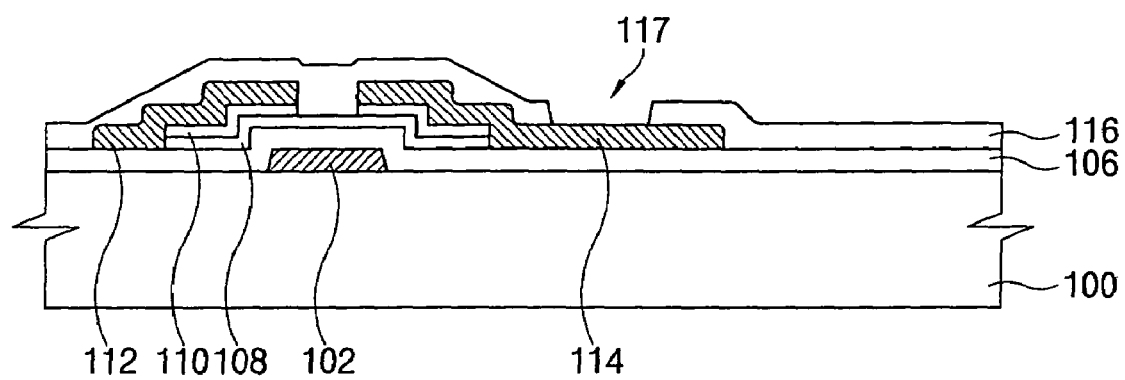
Figure 7B:
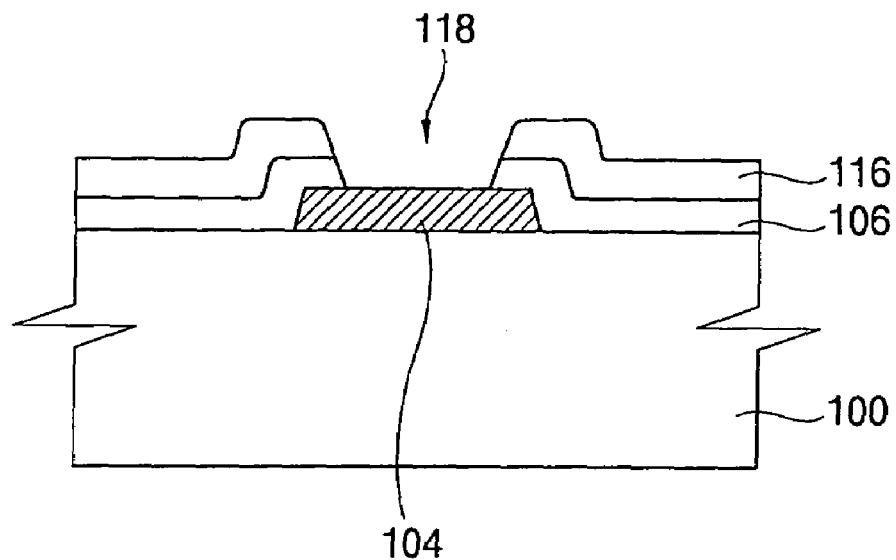
Figure 7C:
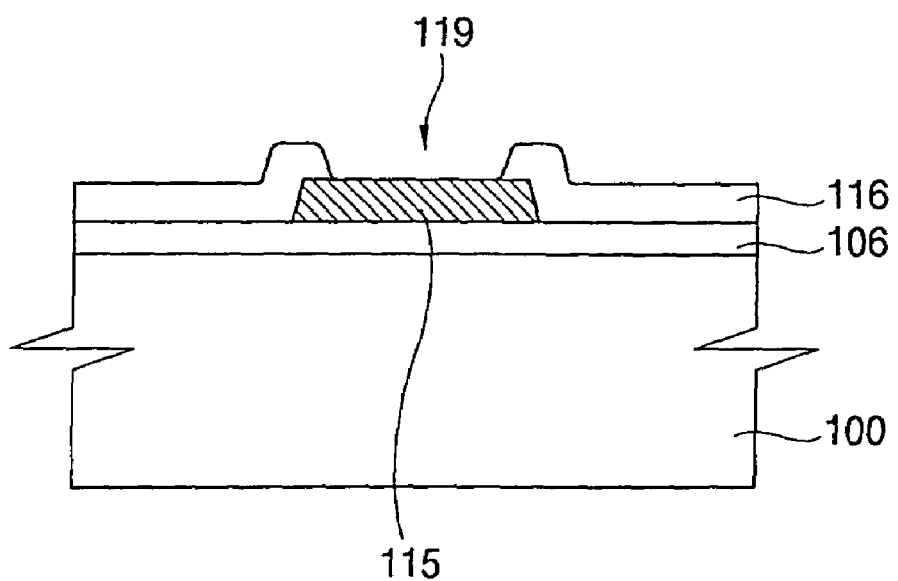

Referring to FIGS. 7A to 7C, silicon nitride is deposited to have a thickness of about 2000 Å on the entire surface of the substrate on which the thin film transistor 150 is formed, thereby forming an inorganic passivation layer 116. The inorganic passivation layer 116 enhances reliability of the transistor 150 and the pads 104 and 115. Also, the inorganic passivation layer 116 enhances the bonding strength of integrated circuits during a subsequent COG bonding.

Subsequently, the inorganic passivation layer 116 and the gate insulation layer 106 are etched away by a photolithography process using a fourth mask, thereby forming a fourth contact hole 117 for exposing the drain electrode 114, a second contact hole 118 for exposing the gate pad 104 and a third contact hole 119 for exposing the data pad 115.

Figure 8A:
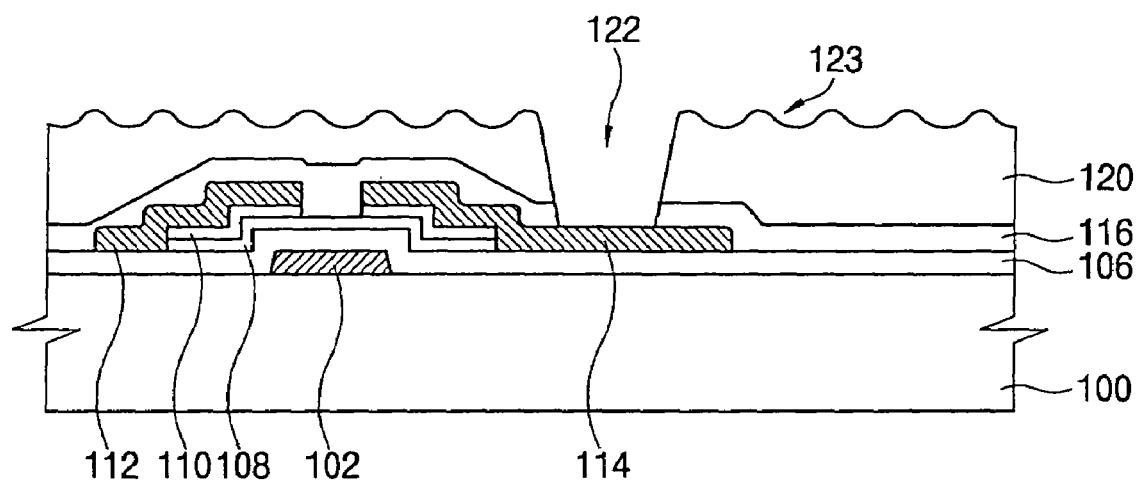
Figure 8B:
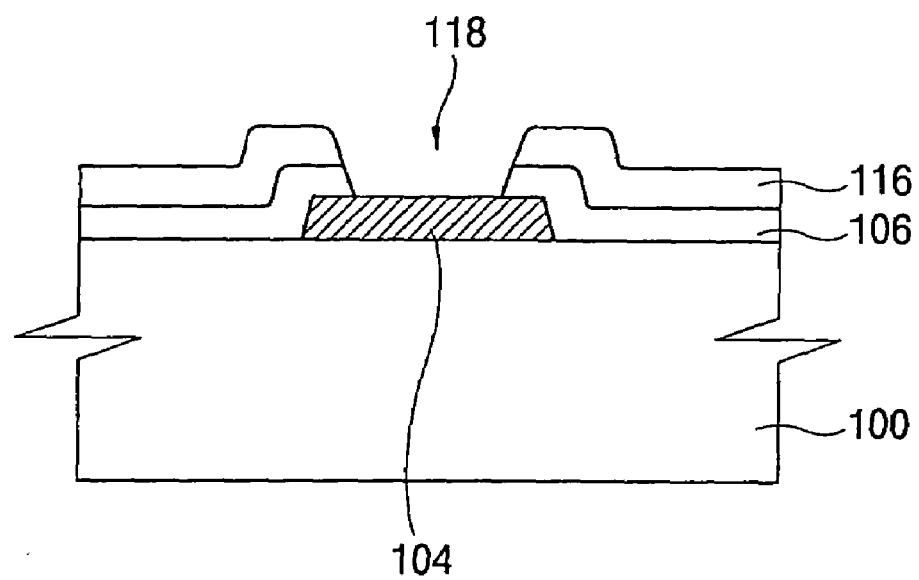
Figure 8C:
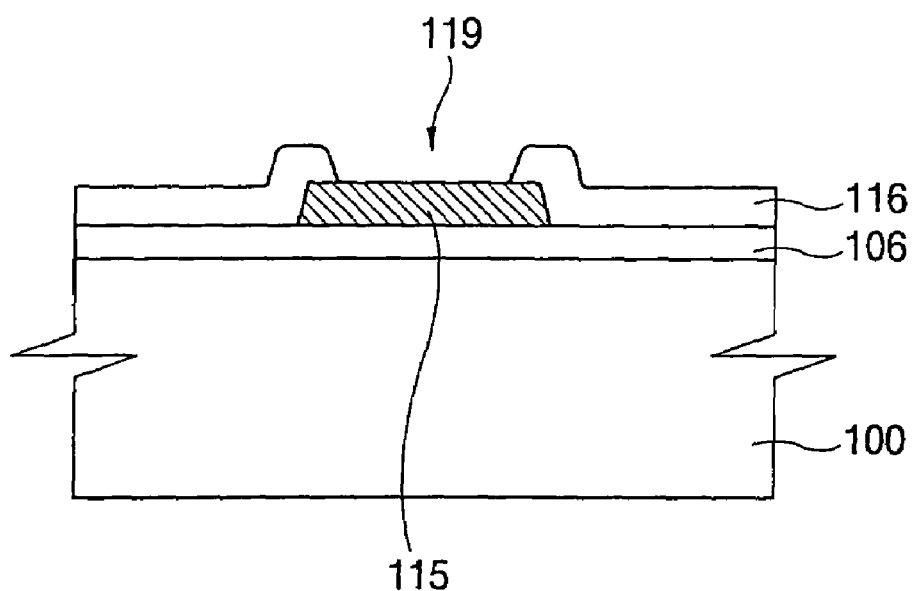

Referring to FIGS. 8A to 8C, photosensitive organic material having a low dielectric constant is coated to a thickness more than 2 μm on the entire surface of the resultant structure including the fourth, second, and third contact holes 117-119, thereby forming an organic passivation layer 120. Because the organic passivation layer 120 prevents forming a parasitic capacitance between the data wiring and a pixel electrode (to be formed), the pixel electrode can be formed so as to be overlapped with the gate and data lines, thereby forming the thin film transistor-liquid crystal display device having a high aperture efficiency.

After a fifth mask (not shown) having a pattern corresponding to a first contact hole 122 is positioned over the organic passivation layer 120 to form the first contact hole 122 through the organic passivation layer 120, a portion of the organic passivation layer 120 over the drain electrode 114 and a portion of the organic passivation layer 120 over the gate pad 104 and the data pad 115 are primarily exposed by a full exposure process. Next, a sixth mask (not shown) for forming micro lenses is positioned over the organic passivation layer 120, and then, a portion of the organic passivation layer 120 besides the first contact hole 122 is secondarily exposed by a lens exposure process.

Subsequently, a development process is carried out using a solution including tetramethyl-ammonium hydroxide (TMAH) to thereby form the first contact hole 122 and a plurality of grooves 123. The first contact hole 122 extends from the fourth contact hole 117 to thereby expose the drain electrode 114. In this case, the organic passivation layer 120 over the gate pad 104 and the data pad 115 is partially removed.

Then, a curing process is performed at a temperature of about 130 to 230° C. for about 100 minutes to reflow and to harden the organic passivation layer 120.

Figure 9A:
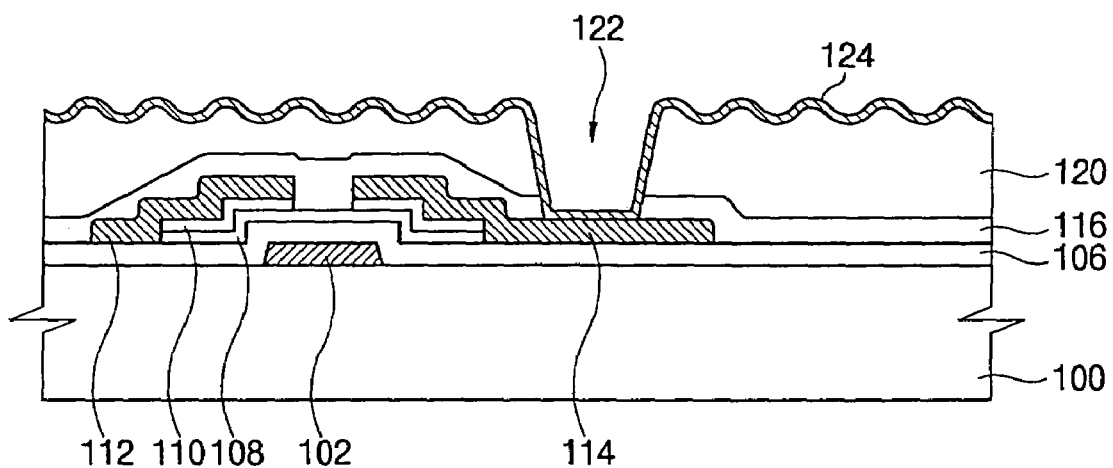
Figure 9B:
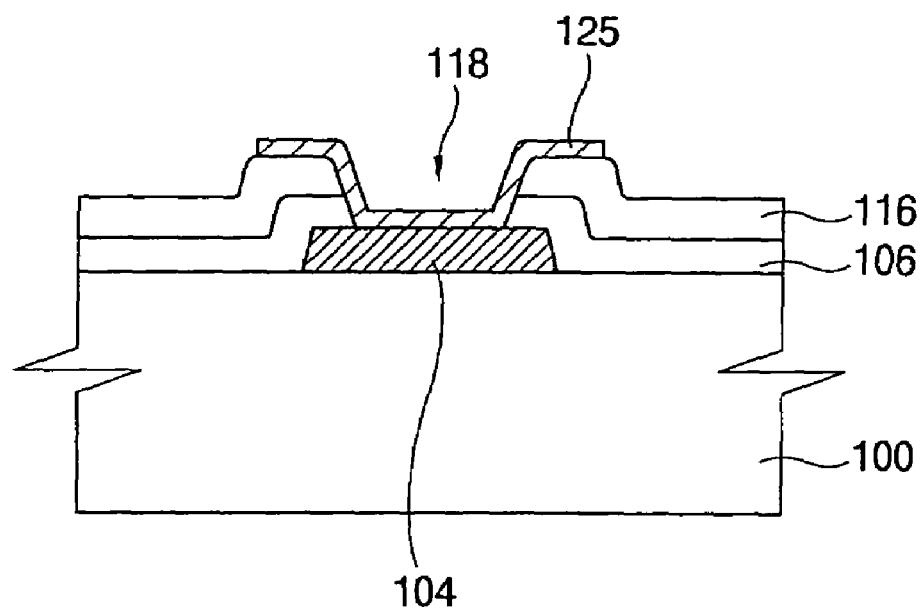
Figure 9C:
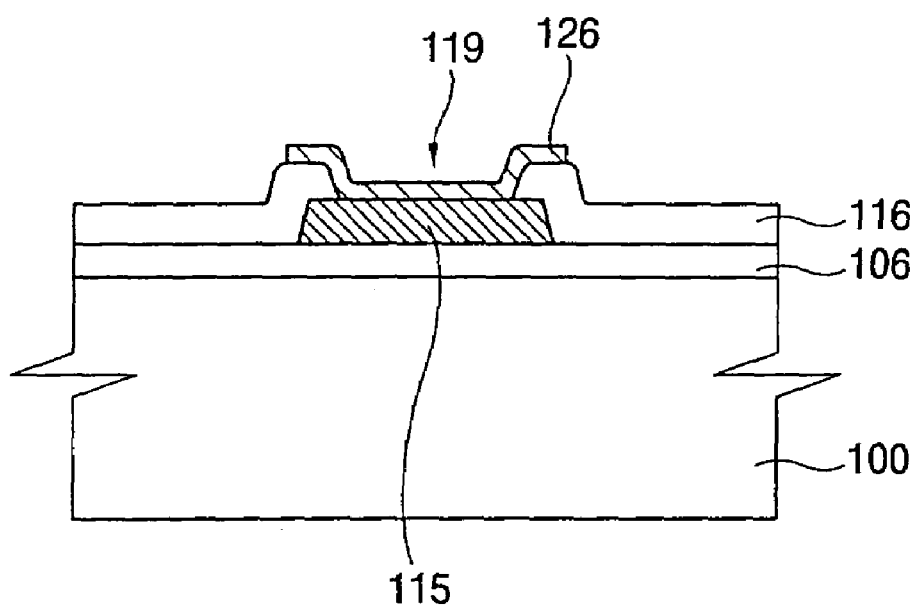

Referring to FIGS. 9A to 9C, an argon (Ar) plasma process is performed for the organic passivation layer 120 so as to increase the adhesiveness between the organic passivation layer 120 and a transparent conductive layer that will be formed thereon. Next, the transparent conductive layer composed of conductive material such as ITO is deposited at a temperature below about 200° C. on the entire surface of the resultant structure. Preferably, the transparent conductive layer is deposited at a temperature of about 20 to about 150° C., and has a thickness of about 400 Å. Subsequently, the transparent conductive layer is annealed at a temperature of above about 100° C. for more than 30 minutes, preferably at 200° C. for about 1 to about 2 hours, to enhance the uniformity of patterning the transparent conductive layer.

Then, after performing a hard-baking process for the transparent conductive layer at a temperature of above 120° C. for more than 30 minutes so as to increase the adhesion between the transparent conductive layer and a photosensitive layer pattern that will be formed in a subsequent photolithography process, the transparent conductive layer is patterned by photolithography and wet etching processes using a seventh mask to thereby form a transparent electrode 124. The transparent electrode 124 is connected to the drain electrode 114 through the first contact hole 122. At the same time, a gate pad electrode 125 and a data pad electrode 126 are formed. The gate pad electrode 125 is connected to the gate pad 104 through the second contact hole 118, and the data pad electrode 126 is connected to the data pad 115 through the third contact hole 119.

Figure 10A:
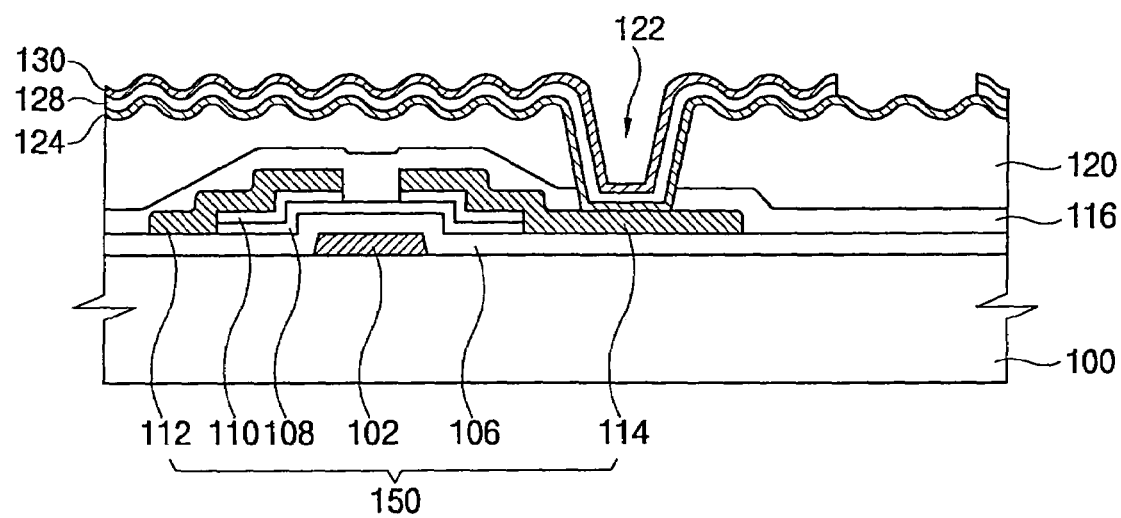
Figure 10B:
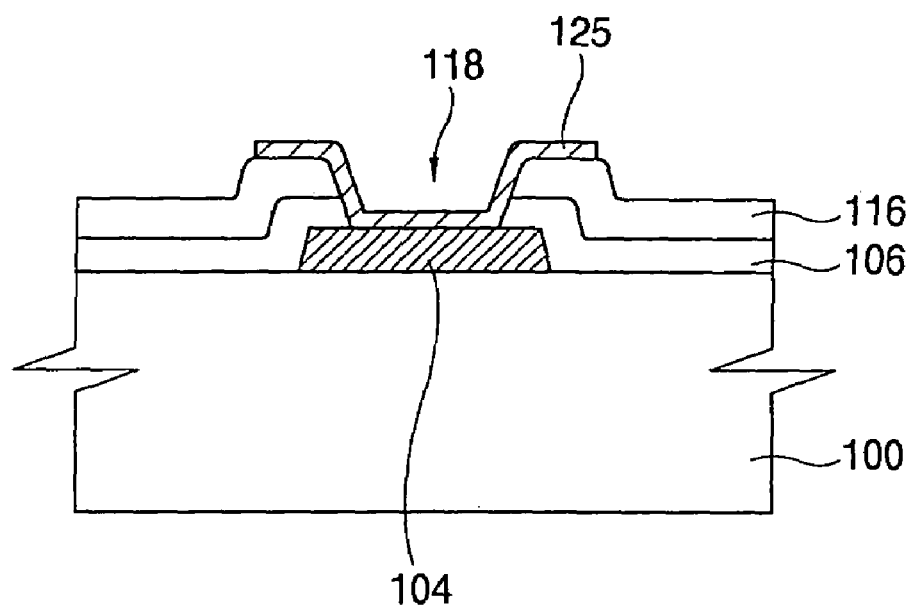
Figure 10C:
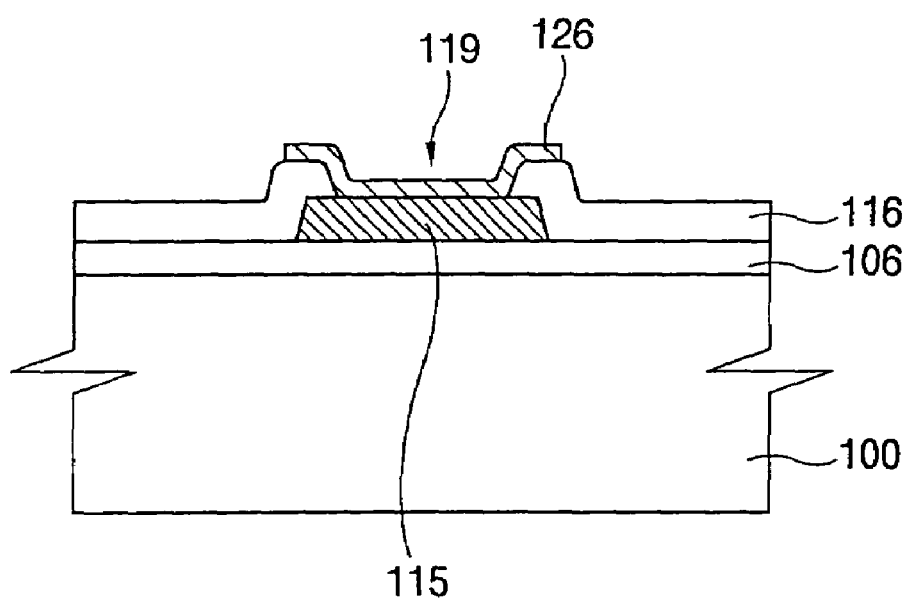

Referring to FIGS. 10A to 10C, a barrier metal layer is deposited to have a thickness of about 500 Å at a temperature of about 20 to about 150° C., preferably at about 50° C., on the entire surface of the resultant structure including the transparent electrode 124 and the pad electrodes 125 and 126. The barrier metal layer is comprised of a metal, e.g., molybdenum-tungsten (Mo—W), and has an etching rate similar to that of a reflective electrode with respect to an etchant for etching a reflective layer constituting the reflective electrode.

Then, on the barrier layer, the reflective layer composed of aluminum-neodymium (Al—Nd) is formed to a thickness of about 1500 Å at a temperature of about 20 to about 150° C., preferably at about 50° C. Next, the reflective layer is annealed at a temperature above about 100° C. for more than about 30 minutes, preferably at about 200° C. for 1 hour, so as to prevent the reflective layer from being lifted during a subsequent develop process. Then, the reflection layer and the barrier metal layer are patterned via photolithography and wet etching processes using an eighth mask to thereby form the reflective electrode 130 and a barrier metal layer pattern 128.

In case of a multilayered pixel electrode using the transparent electrode as a lower electrode, when a photosensitive layer is developed using a TMAH developing solution for patterning the reflective layer, the reflective layer is easily lifted by a potential difference between the transparent electrode comprised of an oxide and the reflective layer. Accordingly, the reflective layer is annealed at a temperature of about 200° C. for about 1 to about 2 hours after depositing the reflective layer, so that the potential difference caused due to the oxide for the transparent electrode is reduced to prevent the reflective layer from being lifted.

Embodiment 2

Figure 11:
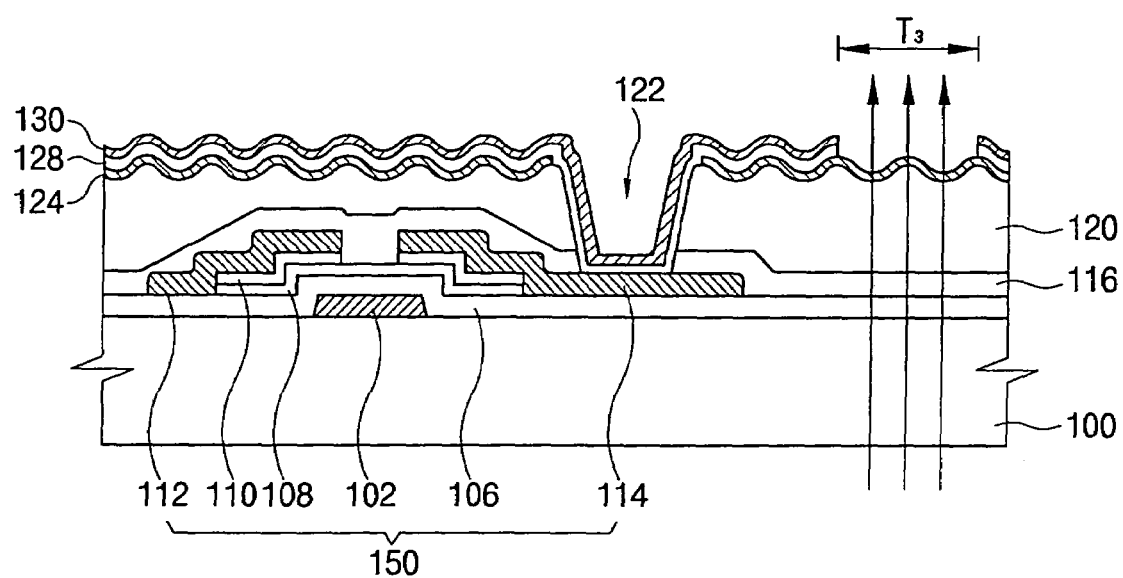
FIG. 11 is a cross-sectional view showing a reflection-transmission type liquid crystal display device according to a second embodiment of the present invention.

FIG. 11 is a cross-sectional view showing a reflection-transmission type liquid crystal display device according to a second embodiment of the present invention.

Referring to FIG. 11, the reflection-transmission type liquid crystal display device according to the second embodiment is the same as that of the first embodiment except one thing. The difference between the second embodiment and the first embodiment is that the transparent electrode 124 is formed on the passivation layer 120 excluding the first contact hole 122, and the barrier metal layer pattern 128 and the reflective electrode 130 are formed on the first contact hole 122 and the transparent electrode 124 so as to be in direct contact with the drain electrode 114 of the thin film transistor 150 through the first contact hole 122.

In case that the data wiring including the drain electrode 114 is formed of a metal film including a chrome (Cr), a thin chrome oxide film is grown on the surface of the metal film. This chrome oxide film is easily removed by ITO etchant. Accordingly, when the transparent electrode 124 on the first contact hole 122 is removed by a wet etching method, the chrome oxide film formed on the surface of the drain electrode 144 is removed at the same time. At this state, the barrier metal layer pattern 128 and the reflective layer 130 is in direct contact with the drain electrode 114, thereby enhancing contact characteristics between the thin film transistor and the pixel electrode.

At this time, since the transparent electrode 124 is electrically connected to the reflective electrode 130 via the barrier metal layer pattern 128, a signal is normally transmitted to the pixel electrode from the thin film transistor.

Embodiment 3

Figure 12:
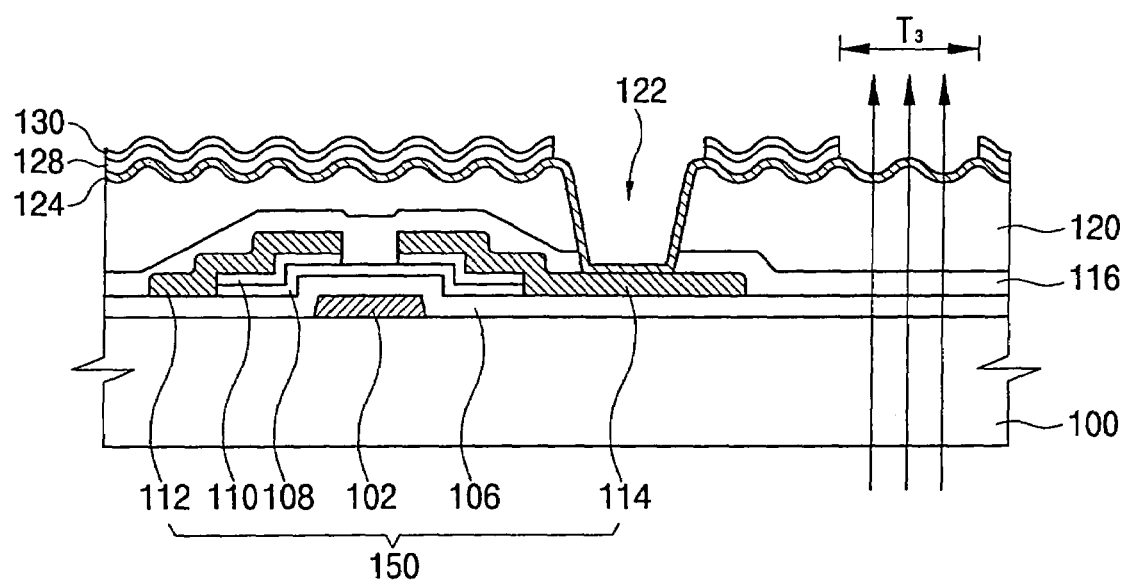
FIG. 12 is a cross-sectional view showing a reflection-transmission type liquid crystal display device according to a third embodiment of the present invention.

FIG. 12 is a cross-sectional view showing a reflection-transmission type liquid crystal display device according to a third embodiment of the present invention.

Referring to FIG. 12, the reflection-transmission type liquid crystal display device according to the third embodiment is the same as that of the first embodiment except one thing. The difference between the third embodiment and the first embodiment is that the barrier metal layer pattern 128 and the reflective electrode 130 are formed only on the transparent electrode 124 excluding the first contact hole 122.

At this time, since the reflective electrode 130 is electrically connected to the transparent electrode 124 via the barrier metal layer pattern 128, a signal is normally transmitted to the pixel electrode from the thin film transistor.

Embodiment 4

Figure 13:
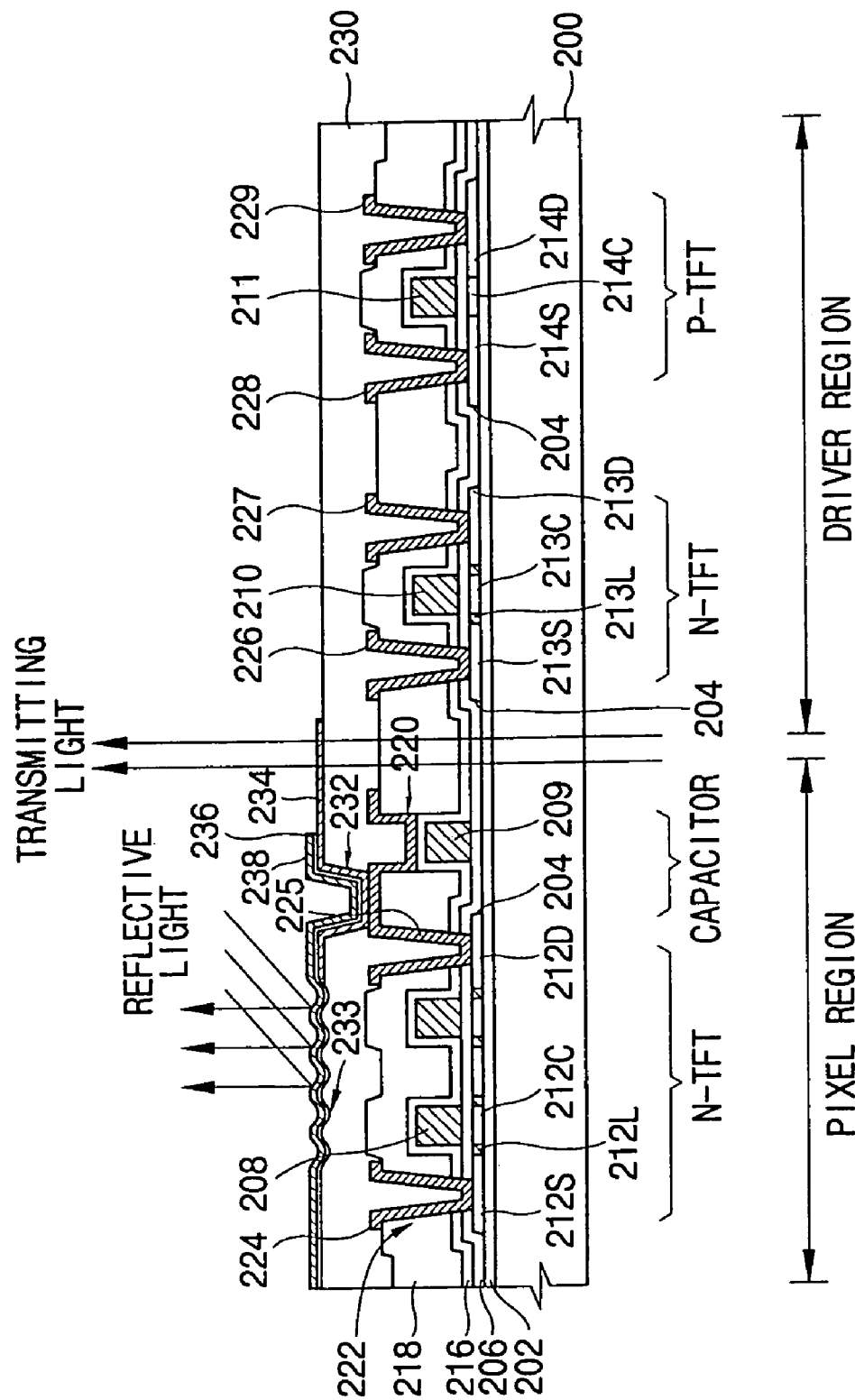
FIG. 13 is a cross-sectional view showing a reflection-transmission type liquid crystal display device according to a fourth embodiment of the present invention.

FIG. 13 is a cross-sectional view showing a reflection-transmission type liquid crystal display device according to a fourth embodiment of the present invention. The liquid crystal display device in FIG. 13 includes a polysilicon thin film transistor having a top-gate structure. FIG. 13 shows a pixel region where an N-type thin film transistor (TFT) is formed and a driver region where an N-type TFT and a P-type TFT are formed.

Referring to FIG. 13, a blocking layer 202 comprised of oxide, e.g., a silicon oxide is formed on an insulation substrate 200 made of glass, quartz, or sapphire. An active pattern 204 composed of polysilicon is formed on the blocking layer 202. A gate insulation layer 206 comprised of silicon oxide is formed on the active pattern 204 and the blocking layer 202.

A gate electrode 208 of the N-type TFT is formed on the gate insulation layer 206 of a pixel region. An intersection where the active pattern 204 is overlapped with the gate electrode 208 becomes a channel region 212C of the N-type TFT. The active pattern 204 is divided into two portions by the channel region 212C. One portion of the active pattern 204 becomes a source region 212S, and the other portion thereof is a drain region 212D.

On the other hand, one portion of the active pattern 204 can be the drain region 212D, and the other portion of the active pattern 204 can be the source region 212S. Also, a lower electrode 209 of a capacitor is formed of the same layer as the gate electrode 208 on the gate insulation layer 206 of the pixel region.

On the gate insulating layer 206 of the driver region, there are formed a gate electrode 210 defining a source region 213S, a drain region 213D, and a channel region 213C of the N-type TFT and a gate electrode 211 defining a source region 214S, a drain region 214D and a channel region 214C of a P-type TFT. In this case, the source/drain of the N-type TFT can be formed of a lightly doped drain (LDD) structure to increase the transistor reliability. Reference numerals of 212L and 213L represent LDD regions.

A first interlayer dielectric layer 216 and a second interlayer dielectric layer 218 are successively formed on the gate electrodes 208, 210, and 211, the lower electrode 209 of the capacitor, and the gate insulation layer 206. The first interlayer dielectric layer 216 is made of silicon oxide and the second interlayer dielectric layer 218 is composed of nitride, e.g., a silicon nitride.

An opening 220 exposing the first interlayer dielectric layer 216 over the lower electrode 209 of the capacitor is formed through the second interlayer dielectric layer 218. Also, contact holes 222 are formed through the first interlayer dielectric layer 216, the second interlayer dielectric layer 218, and the gate insulating layer 206 over the source/drain regions 212S and 212D of the pixel region, and over the source/drain regions 213S, 213D, 214S, and 214D of the driver region.

A source electrode 224 and a drain electrode 225 are formed on the second interlayer dielectric layer 218 so as to be respectively connected to the source and drain regions 212S and 212D in the pixel region through the contact holes 222. Also, a source electrode 226 and a drain electrode 227 are formed on the second interlayer dielectric layer 218 so as to be respectively connected to the source and drain regions 213S and 213D of the N-type TFT in the driver region through the contact holes 222. Furthermore, a source electrode 228 and a drain electrode 229 are formed on the second interlayer dielectric layer 218 so as to be respectively connected to the source and drain regions 214S and 214D of the P-type TFT in the driver region through the contact holes 222.

The drain electrode 225 of the pixel region is also formed in the opening 220 to be overlapped with the lower electrode 209 of the capacitor, so such overlapped portion is provided as an upper electrode of the capacitor. Hence, the first interlayer dielectric layer 216 located over the lower electrode 209 of the capacitor serves as a dielectric layer of the capacitor.

In the conventional liquid crystal display device, a buffer layer composed of $n^+$ doped silicon is additionally formed under an active pattern, and then, the buffer layer serves as a lower electrode of a capacitor. Also, a gate insulation layer is used as a dielectric layer of the capacitor, and an upper electrode of the capacitor is formed of the same layer as the gate electrode. However, in the present invention, additional deposition and etching processes for forming the lower electrode of the capacitor are not needed because the lower electrode 209 is formed of the same layer as the gate electrode 208 and the drain electrode 225 is used as the upper electrode of the capacitor. Therefore, the manufacturing process is simplified.

A passivation layer 230 comprised of photosensitive organic material is formed on the source and drain electrodes 224, 225, 226, 227, 228, and 229 and the second interlayer dielectric layer 218. A pixel electrode is formed on the passivation layer 230, and is connected to the drain electrode 225 through a via hole 232 formed in the passivation layer 230 over the drain electrode 225 of the pixel region.

The pixel electrode includes a transparent electrode 234 and a reflective electrode 238. The transparent electrode 234 is comprised of a conductive oxide such as ITO, and the reflective electrode 238 is made of metal such as aluminum-neodymium (Al—Nd). A barrier metal layer pattern 236 is formed between the transparent electrode 234 and the reflective electrode 238 to prevent galvanic corrosion generated between the transparent electrode 234 and the reflective electrode 238. The barrier metal layer pattern 236 is comprised of a metal having etching rate identical to that of the reflective electrode 238 with respect to a predetermined etchant for etching the reflective electrode 238. Preferably, the barrier metal layer pattern 236 is comprised of molybdenum-tungsten (Mo—W), and patterned to have a shape identical to that of the reflective electrode 238.

As described above, since the barrier metal layer pattern 236 is formed between the transparent electrode 234 and the reflective electrode 238 and the transparent electrode 234 is electrically connected to the reflective electrode 238, an etching process step for forming a contact hole connecting the reflective electrode 238 to the drain electrode 225 can be eliminated. Therefore, the manufacturing process is simplified.

FIGS. 14A to 14G are cross-sectional views illustrating a method for manufacturing the reflection-transmission type liquid crystal display device according to the fourth embodiment of the present invention.

Figure 14A:
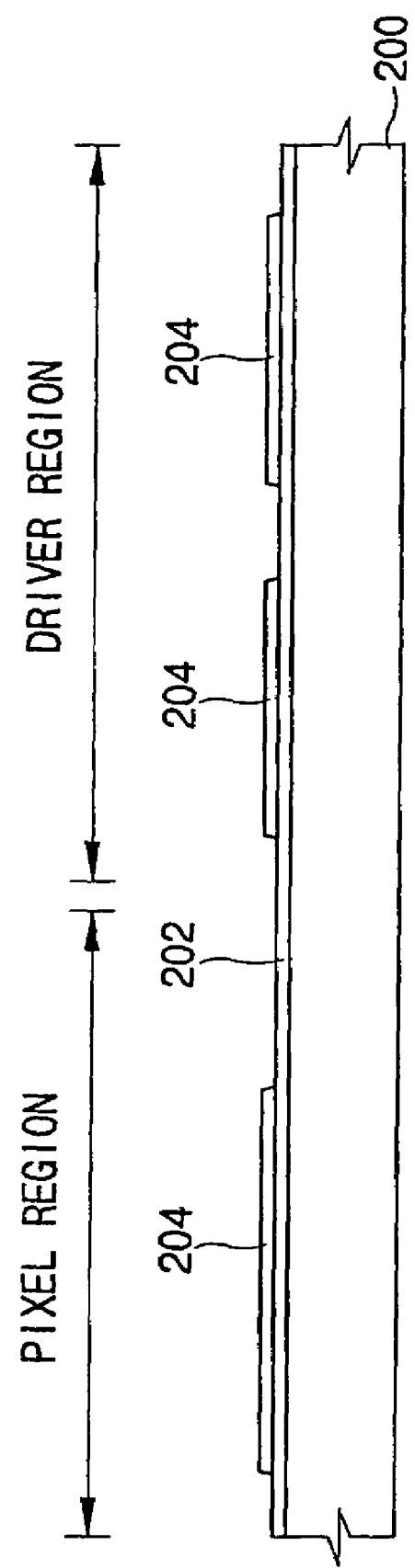

Referring to FIG. 14A, silicon oxide is deposited to a thickness of about 2000 Å by a PECVD method on a substrate 200 made of glass, quartz or sapphire, thereby forming a blocking layer 202. The blocking layer 202 may be skipped, but it is preferred to form the blocking layer 202 to prevent impurities in the substrate 200 penetrating into a silicon layer during a subsequent crystallization process for an amorphous silicon layer though the blocking layer 202.

After depositing an amorphous silicon layer (not shown) to have a thickness of about 500 Å by a low pressure chemical vapor deposition (LPCVD) method or a PECVD method on the blocking layer 202, the amorphous silicon layer is crystallized into a polysilicon layer by laser annealing or furnace annealing. Then, the polysilicon layer is patterned to form an active pattern 204 by a photolithography process using a first mask.

Figure 14B:
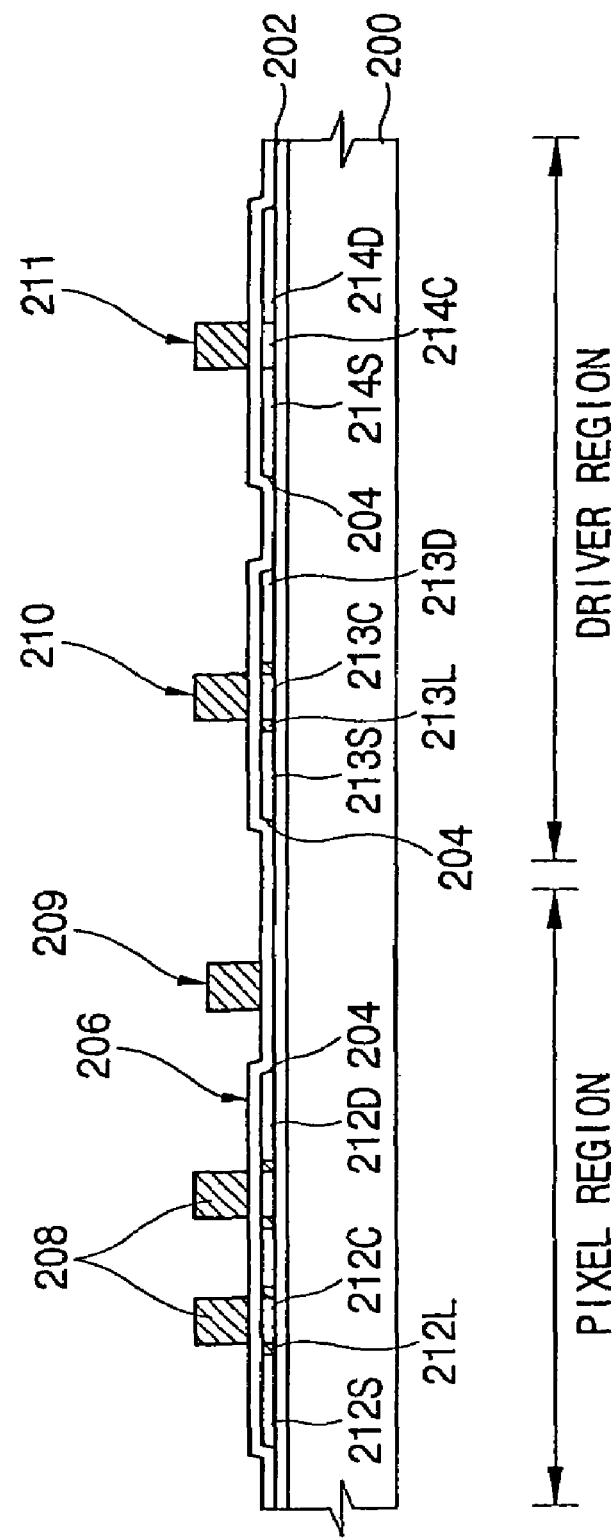

Referring to FIG. 14B, a silicon oxide is deposited to a thickness of about 1000 Å by a PECVD method on the active pattern 204 and the blocking layer 202, thereby forming a gate insulation layer 206.

After a gate layer comprised of aluminum-neodymium (Al—Nd) is deposited to a thickness of about 2500 Å on the gate insulation layer 206, a portion of the P-type TFT in the driver region is opened and then, an exposed gate layer is etched by a photolithography process using a second mask to thereby form a gate electrode 211 of the P-type TFT in the driver region. Subsequently, $P^+$ impurities are implanted by an ion implantation process to thereby form a source region 214S and a drain region 214D of the P-type TFT in the driver region. During the ion implantation process, the $P^+$ impurities are not implanted onto the gate electrode 211 so as to define a channel region 214C in the active pattern 204.

After opening portions of the N-type TFTs in the pixel and the driver regions by a photolithography process using a third mask, an exposed gate layer is etched to form a lower electrode 209 of the capacitor and gate electrodes 208 and 210 of the N-type TFTs. Then, $N^+$ impurities are implanted by an ion implantation process to thereby form a source region 212S and a drain region 212D of the N-typed TFT in the pixel region, and a source region 213S and a drain region 213D of the N-typed TFT in the driver region. During the ion implantation process, the $N^+$ impurities are not implanted onto the gate electrodes 208 and 210 so as to define channel regions 212C and 213C in the active pattern 204. In this case, LDD regions 212L and 213L are formed by ion implanting $N^-$ impurities onto the N-type TFTs to accomplish the transistor having an LDD structure.

Figure 14C:
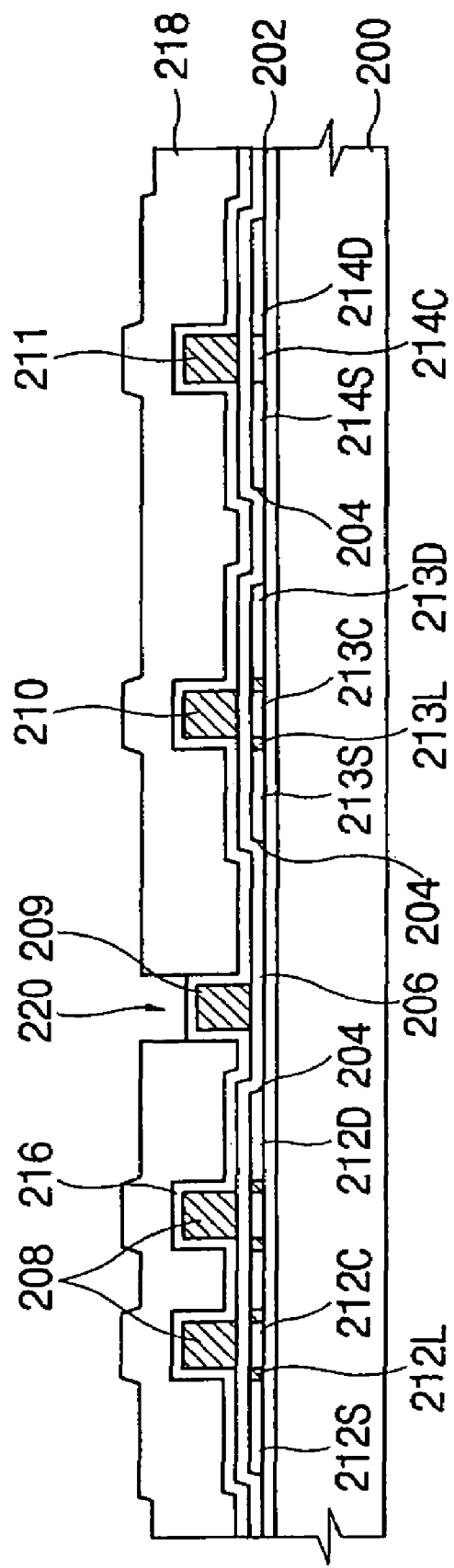

Referring to FIG. 14C, a laser annealing or a furnace annealing is carried out to activate the doped ions in the source and drain regions and to cure the damaged silicon layer. Then, a first interlayer dielectric layer 216 comprised of silicon oxide is formed to a thickness of about 1000 Å on the entire surface of the resultant structure. After forming a second interlayer dielectric layer 218 comprised of silicon nitride to a thickness of about 4000 Å on the first interlayer dielectric layer 216, the second interlayer dielectric layer 218 is etched by a photolithography process using a fourth mask, thereby forming an opening 220 exposing the first interlayer dielectric layer 216 over the lower electrode 209 of the capacitor.

Figure 14D:
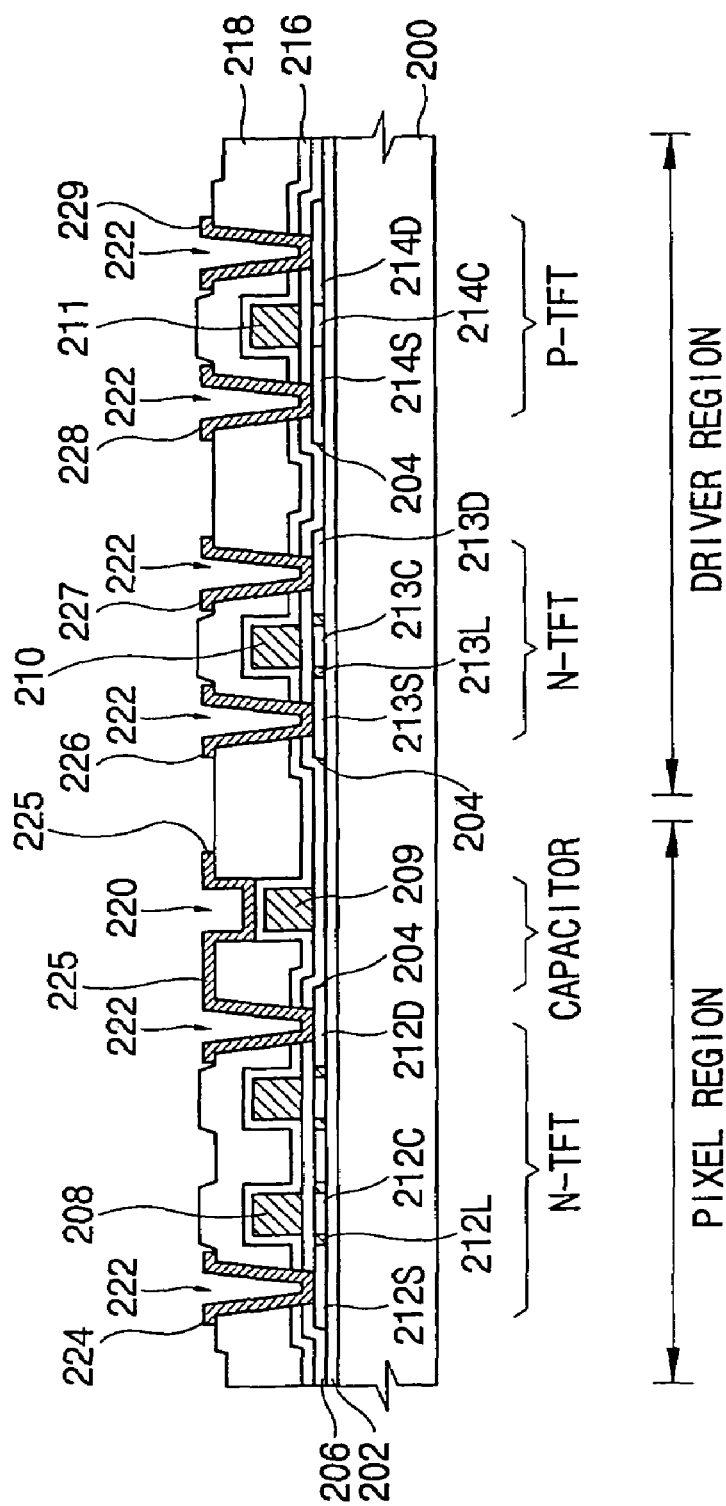

Referring to FIG. 14D, the second interlayer dielectric layer 218, the first interlayer dielectric layer 216, and the gate insulating layer 206 are successively etched by a photolithography process using a fifth mask, thereby forming contact holes 222 exposing the source and drain regions of the pixel and the driver regions.

After a data layer comprised of molybdenum-tungsten (Mo—W) is formed to a thickness of about 3000 Å on the opening 220, the contact holes 222, and the second interlayer dielectric layer 218, the data layer is patterned by a photolithography process using a sixth mask so as to form a source electrode 224 and a drain electrode 225 of the pixel region, a source electrode 226 and a drain electrode 227 of the N-type TFT in the driver region, and a source electrode 228 and a drain electrode 229 of the P-type TFT in the driver region. The source and drain electrodes 224, 225, 226, 227, 228, and 229 are connected to the source and drain regions through the contact holes 222, respectively. At that time, the drain electrode 225 in the pixel region is also formed in the opening 220 to be overlapped with the lower electrode 209 of the capacitor, so such overlapped portion is provided as an upper electrode of the capacitor.

Referring to FIG. 14E, a photosensitive organic film is coated to a thickness of about 3 μm on the source and drain electrodes 224, 225, 226, 227, 228, and 229, and on the second interlayer dielectric layer 218, thereby forming a passivation layer 230.

To form a via hole 232 through the passivation layer 230, after a seventh mask (not shown) corresponding to the via hole 232 is positioned over the passivation layer 230, a portion of the passivation layer 230 over the drain electrode 225 in the pixel region is primarily exposed by a full exposure process using the seventh mask. Subsequently, after an eighth mask (not shown) for forming micro lenses is positioned over the passivation layer 230, a portion of the passivation layer 230 except the via hole region is secondarily exposed by a lens exposure process using the eighth mask. Then, a develop process is performed with a solution including TMAH to thereby form the via hole 232 and a plurality of grooves 233. The drain electrode 225 in the pixel region is exposed through the via hole 232. Then, a curing process is performed at a temperature of about 130 to about 230° C. for about 100 minutes to reflow and to harden the passivation layer 230.

Figure 14F:
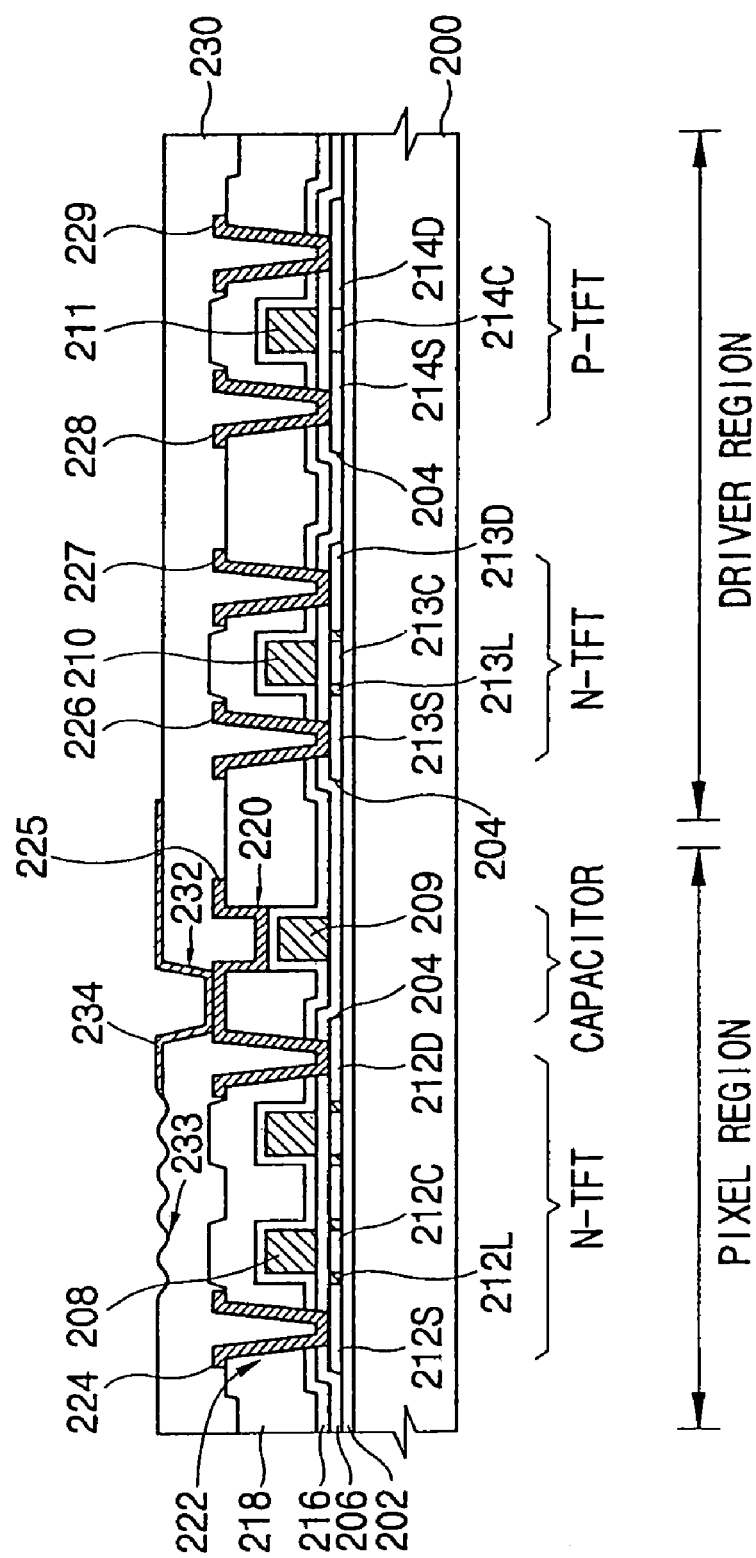

Referring to FIG. 14F, an argon plasma process is performed for the passivation layer 230 so as to increase the adhesion between the organic passivation layer 230 and a transparent conductive layer to be formed on thereon. The transparent conductive layer composed of conductive material such as ITO is formed to a thickness of about 450 Å at a temperature below 200° C., preferably at about 20 to about 150° C., on the via hole 232 and the passivation layer 230. Subsequently, the transparent conductive layer is annealed at a temperature of above 100° C. for more than 30 minutes, preferably at 200° C. for about 1 to about 2 hours, to enhance uniformity of patterning the transparent conductive layer.

Then, after a hard-baking process is performed for the transparent conductive layer at a temperature above 120° C. for more than about 30 minutes so as to increase the adhesion between the transparent conductive layer and a photosensitive layer pattern that will be formed in a subsequent photolithography process, a transparent conductive layer is patterned by photolithography and wet etching processes using a ninth mask to form a transparent electrode 234. The transparent electrode 234 is connected to the drain electrode 225 in the pixel region through the via hole 232.

Figure 14G:
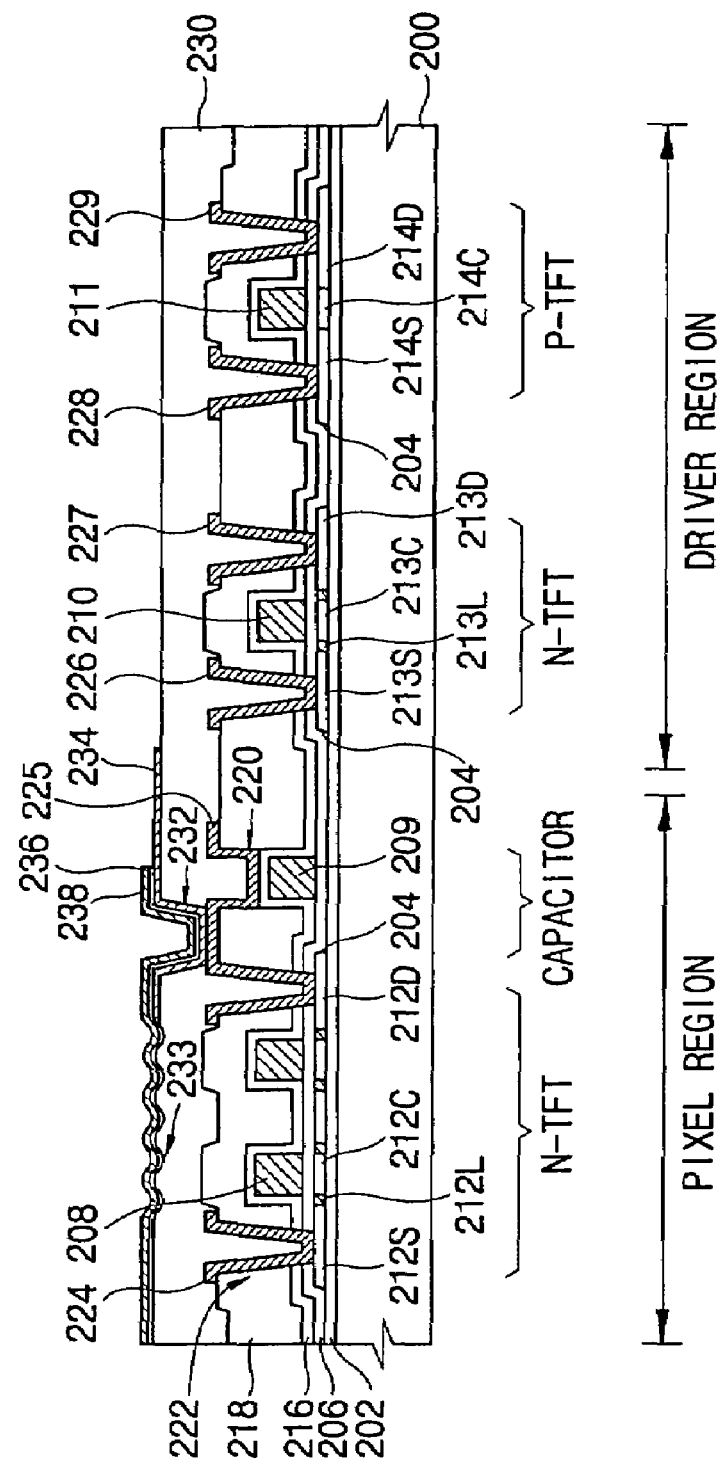

Referring to FIG. 14G, a barrier metal layer is formed on the entire surface of the resultant structure including the transparent electrode 234. The barrier metal layer is composed of metal, for example molybdenum-tungsten (Mo—W) having an etching rate similar to that of a reflective electrode with respect to a predetermined etchant for etching a reflective layer to be formed later. The barrier metal layer having a thickness of about 500 Å is formed at a temperature of about 20 to about 150° C., preferably at about 50° C. Subsequently, the reflective layer comprised of aluminum-neodymium (Al—Nd) is formed to a thickness of about 2000 Å at a temperature of about 20 to about 150° C., preferably at about 50° C., on the barrier metal layer. Then, the reflective layer is annealed at a temperature above 100° C. for more than about 30 minutes, preferably at about 200° C. for 1 hour, so as to prevent the reflective layer from being lifted during a subsequent develop process. Subsequently, the reflection layer and the metal barrier layer are patterned by a photo process and a wet etching process using a tenth mask, thereby forming the reflective electrode 238 and a metal barrier layer pattern 236. The reflective electrode 238 directly contacts the transparent electrode 234.

Embodiment 5

Figure 15:
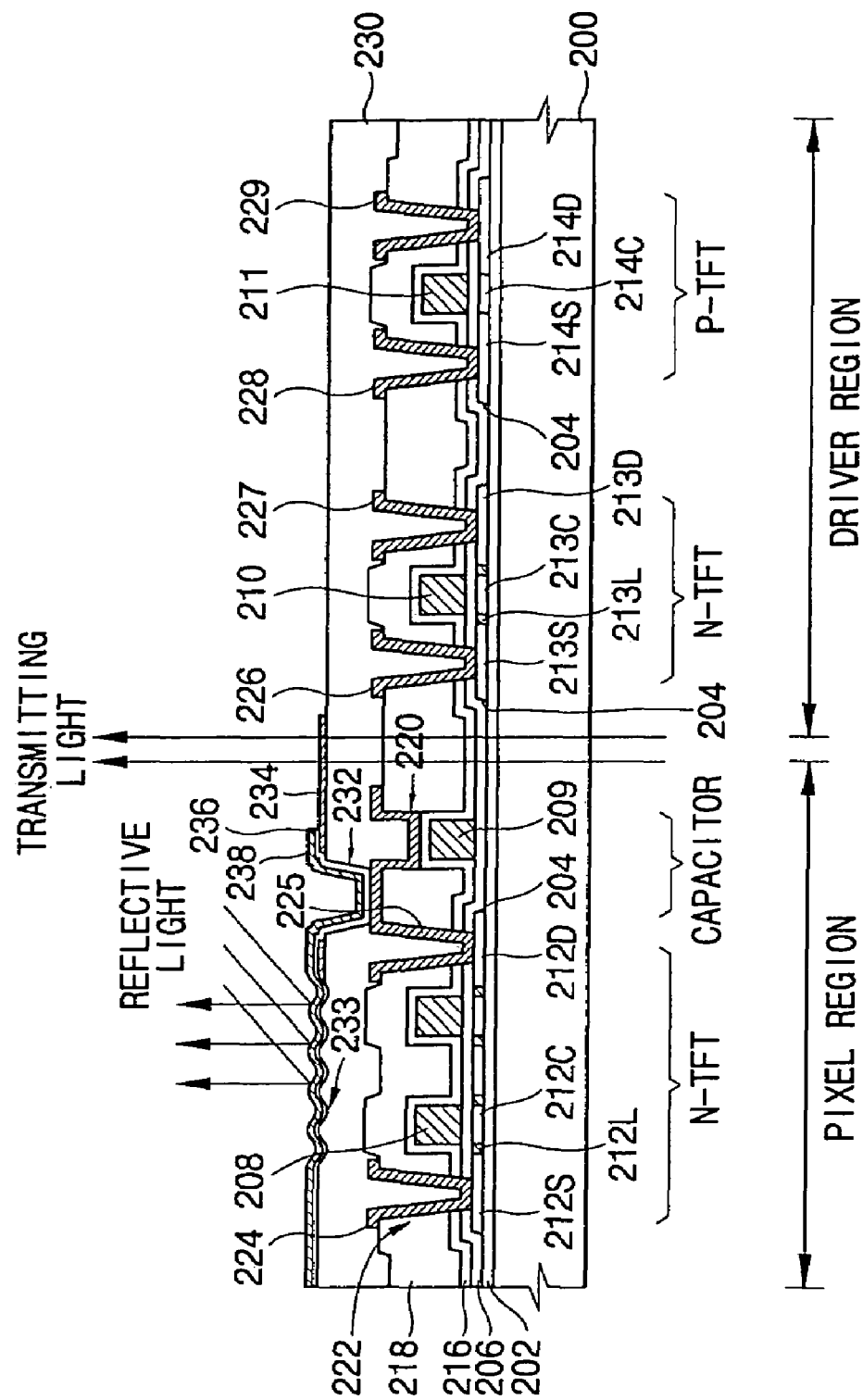
FIG. 15 is a cross-sectional view showing a reflection-transmission type liquid crystal display device according to a fifth embodiment of the present invention.

FIG. 15 is a cross-sectional view showing a reflection-transmission type liquid crystal display device according to a fifth embodiment of the present invention.

Referring to FIG. 15, the reflection-transmission type liquid crystal display device according to the fifth embodiment is the same as that of the fourth embodiment except one thing. The difference between the fifth embodiment and the fourth embodiment is that the transparent electrode 234 is formed on the passivation layer 230 excluding the via hole 232, and the barrier metal layer pattern 236 and the reflective electrode 238 are formed on the via hole 232 and the transparent electrode 234 so as to be in direct contact with the drain electrode 225 of the thin film transistor through the via hole 232.

Embodiment 6

Figure 16:
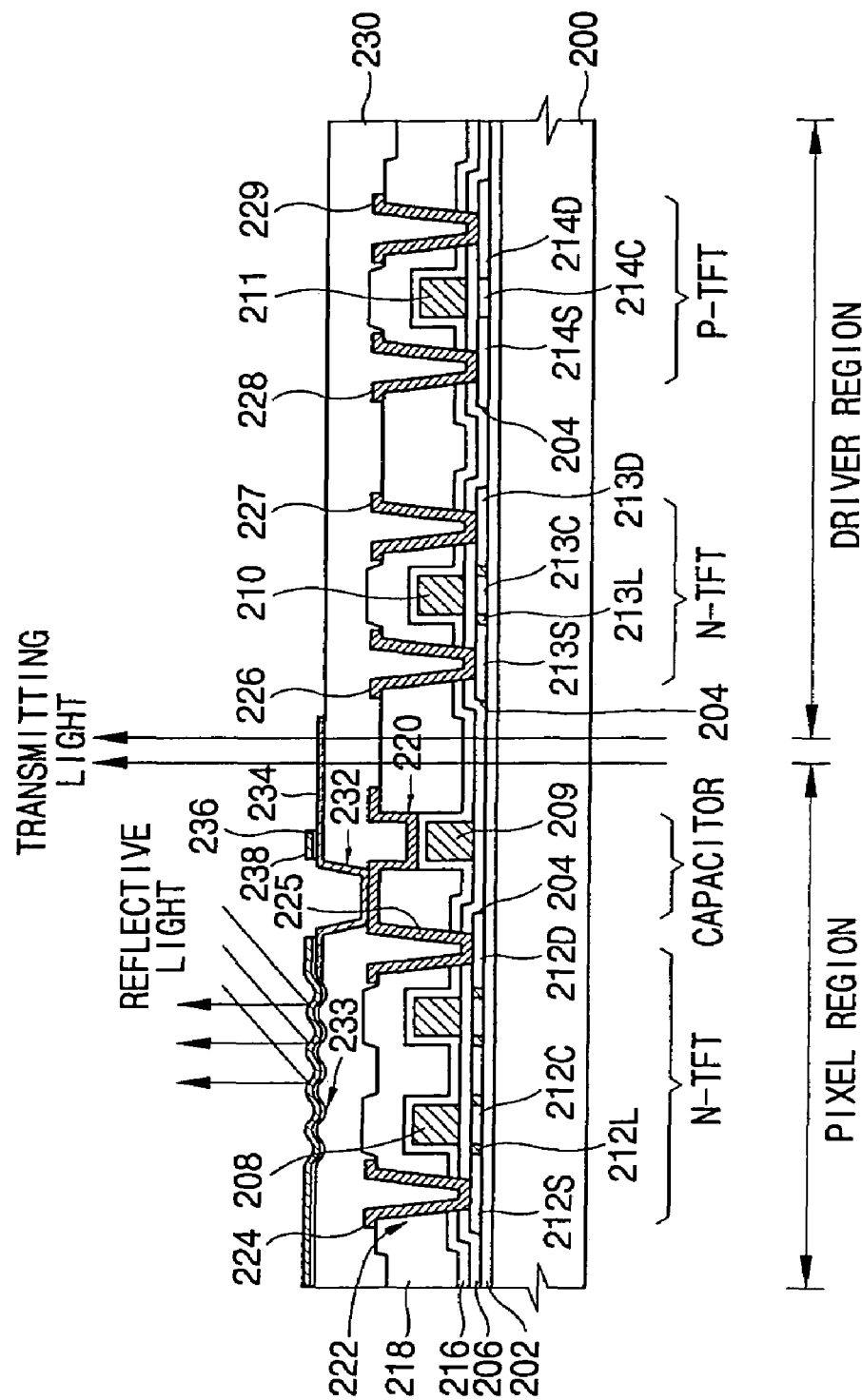
FIG. 16 is a cross-sectional view showing a reflection-transmission type liquid crystal display device according to a sixth embodiment of the present invention.

FIG. 16 is a cross-sectional view showing a reflection-transmission type liquid crystal display device according to a sixth embodiment of the present invention.

Referring to FIG. 16, the reflection-transmission type liquid crystal display device according to the sixth embodiment is the same as that of the fourth embodiment except one thing. The difference between the sixth embodiment and the fourth embodiment is that the barrier metal layer pattern 236 and the reflective electrode 238 are formed only on the transparent electrode 234 excluding the via hole 232.

In the above-described embodiments, the transparent electrode and the reflective electrode are patterned using two masks. Advantageously, the transparent electrode and the reflective electrode can be patterned using one mask according to a seventh embodiment of the present invention.

For example, after an argon plasma process is performed to increase the adhesion between an organic passivation layer and the transparent conductive layer, the transparent conductive layer, the barrier metal layer and the reflective layer are successively formed on the resultant structure at a temperature below about 200° C. In this case, the transparent conductive layer is made of ITO, and the metal barrier layer and the reflective layer are composed of Mo—W and Al—Nd, respectively. Then, after an annealing process is performed at a temperature above approximately 200° C. for about 1 hour so as to prevent the reflective layer from being lifted during a subsequent develop process, a photosensitive layer is coated on the reflective layer. Next, the photosensitive layer is exposed and developed using a half-tone mask or a slit mask, thereby forming a photosensitive layer pattern having different thickness at a transmission window and a reflection window.

After the reflection layer and the barrier metal layer are etched using the photosensitive layer pattern as an etching mask, the photosensitive layer pattern is partially removed to have a predetermined thickness by an ashing process or a dry etching process. The transmission window and the reflection window are simultaneously formed when the transparent conductive layer is etched, preferably by using a remaining portion of the photosensitive layer pattern as an etching mask. The location of the transparent electrode substantially coincides with the transmission window, and the reflective electrode is exposed through the reflection window.

Therefore, the transparent electrode, the pad electrode, the barrier metal layer pattern and the reflective electrode are formed using one mask according to the seventh embodiment of the present invention, thereby reducing the number of masks.

According to the present invention, in the multilayered pixel electrode having the transparent electrode as the lower layer, the transparent electrode is in direct contact with the reflective electrode. Preferably, in order to prevent the galvanic corrosion from being generated between the transparent electrode and the reflective electrode, the barrier metal layer pattern is interposed between the transparent electrode and the reflective electrode. Therefore, the manufacturing process is simplified because the transparent electrode is directly connected to the reflective electrode and the process for forming the contact hole connecting the reflective electrode to the thin film transistor is eliminated. In particular, the manufacturing process can be further simplified since the multilayered pixel electrode can be formed using one mask, preferably utilizing the half-tone mask or the slit mask.

In addition, the reflective layer is annealed at the temperature of about 200° C. for about 1 to about 2 hours, whereby preventing the lifting of the reflective electrode in the multilayered pixel electrode having the transparent electrode as the lower layer.

Furthermore, since the pad electrodes are formed of the same layer as the transparent electrode, the pad reliability is increased without metal corrosion when the pad electrodes of the liquid crystal display panel are connected to the external integrated circuits by the COG method.

Although preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. A method of manufacturing a liquid crystal display device, the method comprising:
    forming a gate electrode on display region of a substrate, and a gate pad on a pad region of the substrate located in a periphery of the display region;
    forming a gate insulation layer to cover the gate electrode and the gate pad;
    forming an active pattern and a ohmic contact pattern on the gate insulation layer;
    forming a first electrode and a second electrode on the ohmic contact pattern, and simultaneously forming a data pad on the gate insulation layer in the pad region;
    forming a passivation layer on the first and second electrodes, the data pad, and the gate insulation layer;
    etching the passivation layer and gate insulation layer to form first, second, and third contact holes for exposing the second electrode, the gate pad, and the data pad, respectively;
    forming a transparent electrode on the display region and simultaneously, forming a gate pad electrode and a data pad electrode connected to the gate pad and the data pad through the second and third contact holes, respectively;
    successively forming a barrier metal layer and a reflective layer on the transparent electrode and the pad electrodes;
    annealing the reflective layer for preventing lifting of the reflective layer; and
    patterning the reflective layer and the barrier metal layer to form a reflective electrode and a barrier metal layer pattern on the transparent electrode, wherein the barrier metal layer pattern and the reflective electrode are formed only on the transparent electrode excluding the first contact hole.

2. The method for manufacturing a liquid crystal display device as claimed in claim 1 wherein the active pattern is comprised of amorphous silicon.

3. The method for manufacturing a liquid crystal display device as claimed in claim 1, wherein the active pattern, the ohmic contact pattern, the first electrode, the second electrode, and the data pad are formed using one mask.

4. The method for manufacturing a liquid crystal display device as claimed in claim 3, wherein the passivation layer is comprised of an inorganic passivation layer and an organic passivation layer stacked on the inorganic passivation layer.

5. The method for manufacturing a liquid crystal display device as claimed in claim 4, wherein the organic passivation layer over the second electrode is completely removed, and the organic passivation layer over the data pad and gate pad region is completely removed.

6. The method for manufacturing a liquid crystal display device as claimed in claim 3, wherein the transparent electrode is formed on the first contact hole and the passivation layer so as to be connected to the second electrode through the first contact hole.

7. The method for manufacturing a liquid crystal display device as claimed in claim 1, wherein forming the transparent electrode and the gate and data pad electrodes comprises:
    performing an argon plasma process on the passivation layer;
    forming a transparent conductive layer on the first, second, and third contact holes and the passivation layer;
    annealing the transparent conductive layer for pattern uniformity of the transparent conductive layer;
    hard-baking the transparent conductive layer for increasing the adhesion of the transparent conductive layer; and
    patterning the transparent conductive layer.

8. The method for manufacturing a liquid crystal display device as claimed in claim 1, wherein the annealing is performed at a temperature above about 100° C. for more than about 30° minutes.

9. The method for manufacturing a liquid crystal display device as claimed in claim 1, wherein the transparent electrode, the gate pad electrode, the data pad electrode, the barrier metal layer pattern, and the reflective electrode are formed using one mask.

10. The method for manufacturing a liquid crystal display device as claimed in claim 1, wherein the barrier metal layer comprises molybdenum and tungsten.

11. A method for manufacturing a liquid crystal display device, the method comprising:
    forming a gate electrode on a display region of a substrate, and a gate pad on a pad region of the substrate located in periphery of the display region;
    forming a gate insulation layer to cover the gate electrode and the gate pad;
    forming an active pattern and an ohmic contact pattern on the gate insulation layer;

forming a first electrode and a second electrode on the ohmic contact pattern, and simultaneously forming a data pad on the gate insulation layer in the pad region;

forming a passivation layer on the first and second electrodes, the data pad, and the gate insulation layer;

etching the passivation layer and gate insulation layer to form first, second, and third contact holes for exposing the second electrode, the gate pad, and the data pad, respectively, forming a transparent electrode on the display region and simultaneously, forming a gate pad electrode and a data pad electrode connected to the gate pad and the date pad through the second and third contact holes, respectively;

successively forming a barrier metal layer and a reflective layer on the transparent electrode and the pad electrodes;

annealing the reflective layer for preventing lifting of the reflective layer; and patterning the reflective layer and the barrier metal layer to form a reflective electrode and a barrier metal layer pattern on the transparent electrode, wherein the transparent electrode is formed only on the passivation layer excluding first contact hole, and the barrier metal layer pattern and the reflective electrode are formed on the first contact hole and the transparent electrode so as to be connected to the second electrode through the first contact hole.

12. A method for manufacturing a liquid crystal display device, the method comprising:

forming a gate electrode on display region of a substrate, and a gate pad on a pad region of the substrate located in a periphery of the display region;

forming a gate insulation layer to cover the gate electrode and the gate pad;

forming an active pattern and a ohmic contact pattern on the gate insulation layer;

forming a first electrode and a second electrode on the ohmic contact pattern, and simultaneously forming a data pad on the gate insulation layer in the pad region;

forming a passivation layer on the first and second electrodes, the data pad, and the gate insulation layer;

etching the passivation layer to form first, second, and third contact holes for exposing the second electrode, the gate pad, and the data pad, respectively;

forming a transparent electrode on the display region and simultaneously, forming a gate pad electrode and a data pad electrode connected to the gate pad and the data pad through the second arid third contact holes, respectively, wherein the transparent electrode is formed only on the passivation layer excluding the first contact hole;

successively forming a barrier metal layer and a reflective layer on the transparent electrode and the pad electrodes;

annealing the reflective layer for preventing lifting of the reflective layer; and patterning the reflective layer and the barrier metal layer to form a reflective electrode and a hater metal layer pattern on the transparent electrode, wherein the barrier metal layer pattern and the reflective electrode are formed on the first contact hole and the transparent electrode so as to be connected to the second electrode through the first contact hole.

13. A method for manufacturing a liquid crystal display device, the method comprising:

forming a gate electrode on display region of a substrate, and a gate pad on a pad region of the substrate located in a periphery of the display region;

forming a gate insulation layer to cover the gate electrode and the gate pad;

forming an active pattern and a ohmic contact pattern on the gate insulation layer;

forming a first electrode and a second electrode on the ohmic contact pattern, and simultaneously forming a data pad on the gate insulation layer in the pad region;

forming a passivation layer on the first and second electrodes, the data pad, and the gate insulation layer;

etching the passivation layer to form first, second, and third contact holes for exposing the second electrode, the gate pad, and the data pad, respectively;

forming a Transparent electrode on the display region and simultaneously, forming a gate pad electrode and a data pad electrode connected to the gate pad and the data pad through the second and third contact holes, respectively;

successively forming a barrier metal layer and a reflective layer on the transparent electrode and the pad electrodes;

annealing the reflective layer for preventing lifting of the reflective layer; and patterning the reflective layer and the barrier metal layer to form a reflective layer and a barrier metal layer pattern only on a portion of the transparent electrode.

14. A method fbr manufacturing a liquid crystal display device, the method comprising:

forming a gate electrode on display region of a substrate, and a gate pad on a pad region of the substrate located in a periphery of the display region;

forming a gate insulation layer to cover the gate electrode and the gate pad;

forming an active pattern and a ohmic contact pattern on the gate insulation layer;

forming a first electrode and a second electrode on the ohmic contact pattern, and simultaneously forming a data pad on the gate insulation layer in the pad region;

forming a passivation layer on the first and second electrodes, the data pad, and the gate insulation layer;

etching the passivation layer and gate insulation layer to form first, second, and third contact holes for exposing the second electrode, the gate pad, and the data pad, respectively;

forming a transparent electrode on the display region and simultaneously, forming a gate pad electrode and a data pad electrode connected to the gate pad and the data pad through the second and third contact holes, respectively;

successively forming a barrier metal layer and a reflective layer on the transparent electrode and the pad electrodes;

annealing the reflective layer for preventing lifting of the reflective layer; and patterning the reflective layer and the barrier metal layer to form a reflective electrode and a barrier metal layer pattern on the transparent electrode, wherein the barrier metal layer comprises a material having a etching rate similar to an etching rate of the reflective layer with respect to a predetermined etchant.

* * * * *